United States Patent
Shin et al.

(10) Patent No.: US 11,830,805 B2
(45) Date of Patent: Nov. 28, 2023

(54) VERTICAL MEMORY DEVICE

(71) Applicant: Samsung Electronics Co., Ltd., Suwon-si (KR)

(72) Inventors: Dongha Shin, Hwaseong-si (KR); Jeawon Jeong, Gwacheon-si (KR); Bongsoon Lim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 118 days.

(21) Appl. No.: 17/212,222

(22) Filed: Mar. 25, 2021

(65) Prior Publication Data

US 2021/0366825 A1   Nov. 25, 2021

(30) Foreign Application Priority Data

May 21, 2020  (KR) .................. 10-2020-0060899

(51) Int. Cl.
| | |
|---|---|
| H01L 23/522 | (2006.01) |
| H01L 25/065 | (2023.01) |
| H01L 25/18 | (2023.01) |
| H10B 41/27 | (2023.01) |
| H10B 43/27 | (2023.01) |
| H01L 23/00 | (2006.01) |

(52) U.S. Cl.
CPC .......... *H01L 23/5226* (2013.01); *H01L 24/08* (2013.01); *H01L 25/0657* (2013.01); *H01L 25/18* (2013.01); *H10B 41/27* (2023.02); *H10B 43/27* (2023.02); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | | |
|---|---|---|---|
| 9,236,340 B2 | 1/2016 | Lee et al. | |
| 9,691,782 B1 * | 6/2017 | Hwang | ............ H01L 27/11573 |
| 9,929,174 B1 * | 3/2018 | Mizutani | ........... H01L 27/11582 |
| 10,373,972 B2 * | 8/2019 | Park | ................... G11C 16/0466 |
| 10,522,560 B2 | 12/2019 | Lee | |
| 10,535,599 B2 | 1/2020 | Kim | |
| 11,557,604 B2 * | 1/2023 | Woo | .................. H01L 27/11565 |

(Continued)

*Primary Examiner* — Telly D Green
(74) *Attorney, Agent, or Firm* — Harness, Dickey & Pierce, P.L.C.

(57) ABSTRACT

A vertical memory device includes a plurality of word lines on a substrate, a plurality of word line cut regions extending parallel to each other, a memory cell array comprising a plurality of channel structures extending on the substrate through the plurality of word lines and arranged in a honeycomb structure, a plurality of contacts on the plurality of channel structures, and a plurality of bit lines connected to the plurality of channel structures through the plurality of contacts. The memory cell array comprises a first sub-array and a second sub-array, which are defined by the plurality of word line cut regions and are connected to some identical bit lines from among the plurality of bit lines, and a layout of contacts in the first sub-array from among the plurality of contacts is different from a layout of contacts in the second sub-array from among the plurality of contacts.

18 Claims, 26 Drawing Sheets

(56) References Cited

U.S. PATENT DOCUMENTS

| | | | |
|---|---|---|---|
| 2014/0198572 A1* | 7/2014 | Lee | H01L 27/11565 |
| | | | 257/776 |
| 2015/0340371 A1* | 11/2015 | Lue | H01L 29/66 |
| | | | 257/324 |
| 2016/0260732 A1* | 9/2016 | Lue | H01L 29/786 |
| 2016/0284717 A1* | 9/2016 | Wolstenholme | |
| | | | H01L 27/11524 |
| 2017/0125433 A1* | 5/2017 | Ogawa | H01L 27/11565 |
| 2017/0221813 A1* | 8/2017 | Kim | H01L 28/00 |
| 2018/0102316 A1* | 4/2018 | Kim | H01L 28/00 |
| 2018/0268892 A1* | 9/2018 | Kim | G11C 8/10 |
| 2018/0337054 A1* | 11/2018 | Sung | H01L 29/40114 |
| 2019/0040592 A1* | 2/2019 | De Maria | E02D 31/025 |
| 2019/0109149 A1* | 4/2019 | Park | H01L 27/11582 |
| 2019/0228824 A1* | 7/2019 | Lee | H01L 27/24 |
| 2019/0385681 A1* | 12/2019 | Yun | G11C 16/3445 |
| 2020/0126908 A1* | 4/2020 | Kim | H01L 23/528 |
| 2020/0266207 A1* | 8/2020 | Liu | H01L 29/4234 |
| 2020/0279863 A1* | 9/2020 | Liu | H01L 27/11556 |
| 2020/0303410 A1* | 9/2020 | Kanamori | G11C 16/20 |
| 2020/0381448 A1* | 12/2020 | Lee | H01L 27/11582 |

\* cited by examiner

FIG. 8

| Contact Type | Bit Line | Capacitance | Contact Type | Bit Line | Capacitance |
|---|---|---|---|---|---|
| CG1-CG1 | BL1 | 3+3+3+3=12 | | BL1 | 1+2+2+2=7 |
| CG1-CG1 | BL2 | 1+2+2+2=7 | CG2-CG2 | BL2 | 3+3+3+3=12 |
| CG1-CG1 | BL3 | 2+2+2+1=7 | CG2-CG2 | BL3 | 3+3+3+3=12 |
| | BL4 | 3+3+3+3=12 | CG2 | BL4 | 2+2+2+1=7 |

FIG. 12

| Contact Type | Bit Line | Capacitance | Contact Type | Bit Line | Capacitance |
|---|---|---|---|---|---|
| CG1-CG1 | BL1 | 3+3+2+2=10 | | BL1 | 1+3+3+2=9 |
| | BL2 | 1+2+3+3=9 | CG2-CG2 | BL2 | 3+3+2+2=10 |
| CG2-CG2 | BL3 | 2+2+3+3=10 | CG1-CG1 | BL3 | 3+3+2+1=9 |
| | BL4 | 3+3+2+1=9 | | BL4 | 2+2+3+3=10 |

FIG. 16

| Contact Type | Bit Line | Capacitance | | Contact Type | Bit Line | Capacitance |
|---|---|---|---|---|---|---|
| CG1-CG2- | BL1 | 3+2+2+3=10 | | | BL1 | 1+3+3+2=9 |
| | BL2 | 1+3+3+2=9 | | CG2-CG1- | BL2 | 3+2+2+3=10 |
| CG2-CG1 | BL3 | 2+3+3+1=9 | | CG1-CG2 | BL3 | 3+2+2+3=10 |
| | BL4 | 3+2+2+3=10 | | | BL4 | 2+3+3+1=9 |

FIG. 20

| Contact Type | Bit Line | Capacitance | | Contact Type | Bit Line | Capacitance |
|---|---|---|---|---|---|---|
| CG1-CG1 | BL1 | 3+3+2+3=11 | | | BL1 | 1+2+3+2=8 |
| | BL2 | 1+2+3+2=8 | | CG2-CG2 | BL2 | 3+3+2+3=11 |
| CG2-CG3 | BL3 | 2+2+3+3=10 | | CG1-CG4 | BL3 | 3+3+2+1=9 |
| | BL4 | 3+3+2+1=9 | | | BL4 | 2+2+3+3=10 |

VERTICAL MEMORY DEVICE

CROSS-REFERENCE TO RELATED APPLICATION

This application claims the benefit of Korean Patent Application No. 10-2020-0060899, filed on May 21, 2020, in the Korean Intellectual Property Office, the disclosure of which is incorporated herein in its entirety by reference.

BACKGROUND

Inventive concepts relate to a vertical memory device, and more particularly, to a vertical memory device in which bit lines connected to a plurality of vertical channels exhibit electrical characteristics that are uniform or substantially uniform therebetween.

As information communication devices become multi-functional, integrated circuit devices including memory devices are required and/or desired to have larger capacity and be more highly integrated. Along with the reduction in sizes of memory cells for higher integration, operation circuits and wiring structures included in memory devices for operations and electrical connections of the memory devices have been more complicated. Therefore, there is a desire/demand for integrated circuit devices including memory devices that have structures having excellent electrical characteristics while exhibiting improved degrees of integration.

SUMMARY

Inventive concepts provide a vertical memory device in which electrical characteristics of respective bit lines are uniform therebetween.

According to some example embodiments of inventive concepts, there is provided a memory device including a plurality of word lines on a substrate, the plurality of word lines extending, in a horizontal direction that is parallel to a main surface of the substrate, the plurality of word lines stacked in a vertical direction, a plurality of word line cut regions extending parallel to each other in a first horizontal direction and defining widths of the plurality of word lines, the widths in a second horizontal direction perpendicular to the first horizontal direction, a memory cell array comprising a plurality of channel structures extending on the substrate in the vertical direction through the plurality of word lines and arranged in a honeycomb structure, a plurality of contacts on the plurality of channel structures, and a plurality of bit lines connected to the plurality of channel structures through the plurality of contacts. The memory cell array comprises a first sub-array and a second sub-array, which are defined by the plurality of word line cut regions and are connected to some identical bit lines from among the plurality of bit lines, and a layout of contacts in the first sub-array from among the plurality of contacts is different from a layout of contacts in the second sub-array from among the plurality of contacts.

According to some example embodiments of inventive concepts, there is provided a memory device including a plurality of word lines extending on a substrate in a horizontal direction parallel to a main surface of the substrate, the plurality of word lines overlapping each other in a vertical direction, a plurality of word line cut regions extending parallel to each other in a first horizontal direction and defining widths of the plurality of word lines in a second horizontal direction, the second horizontal direction perpendicular to the first horizontal direction, a memory cell array comprising a plurality of channel structures which extend, on the substrate in the vertical direction through the plurality of word lines, a plurality of contacts arranged on the plurality of channel structures, and a plurality of bit lines connected to the plurality of channel structures through the plurality of contacts. The memory cell array comprises a first sub-array and a second sub-array which are defined by the plurality of word line cut regions and are connected to first to fourth bit lines from among the plurality of bit lines, and a layout of contacts in the first sub-array from among the plurality of contacts is different from a layout of contacts in the second sub-array from among the plurality of contacts.

According to some example embodiments of inventive concepts, there is provided a memory device including a memory cell region including a first metal pad, and a peripheral circuit region including a second metal pad, the peripheral circuit region vertically connected to the memory cell region by the first metal pad and the second metal pad. The memory cell region includes a plurality of word lines and a string select line, the plurality of word lines and the string select line extending on a substrate in a horizontal direction parallel to a main surface of the substrate, the plurality of word lines overlapping each other in a vertical direction, a plurality of word line cut regions extending parallel to each other in a first horizontal direction and defining widths of the plurality of word lines in a second horizontal direction that is perpendicular to the first horizontal direction, a plurality of select line cut regions defining a width of the string select line in the second horizontal direction, a memory cell array comprising a plurality of channel structures, which extend, on the substrate, in the vertical direction through the plurality of word lines and are arranged in a honeycomb structure, a plurality of contacts on the plurality of channel structure; and a plurality of bit lines connected to the plurality of channel structures through the plurality of contacts. Two or more bit lines are arranged over one of the plurality of channel structures and overlap the one channel structure in the vertical direction, the memory cell array comprises a first sub-array and a second sub-array, the first sub-array and the second sub-array defined by the plurality of word line cut regions and connected to first to fourth bit lines from among the plurality of bit lines, and a layout of contacts in the first sub-array from among the plurality of contacts is different from a layout of contacts in the second sub-array from among the plurality of contacts.

BRIEF DESCRIPTION OF THE DRAWINGS

Some example embodiments of inventive concepts will be more clearly understood from the following detailed description taken in conjunction with the accompanying drawings in which:

FIG. 8 is a diagram illustrating parasitic capacitance of channel structures connected to each bit line of a memory device according to inventive concepts;

FIG. 12 is a diagram illustrating parasitic capacitance of channel structures connected to each bit line of a memory device according to inventive concepts;

FIG. 16 is a diagram illustrating parasitic capacitance of channel structures connected to each bit line of a memory device according to inventive concepts;

FIG. 20 is a diagram illustrating parasitic capacitance of channel structures connected to each bit line of a memory device according to inventive concepts;

DETAILED DESCRIPTION OF EXAMPLE EMBODIMENTS

Hereinafter, some example embodiments of inventive concepts will be described in detail with reference to the accompanying drawings.

Figure 1:
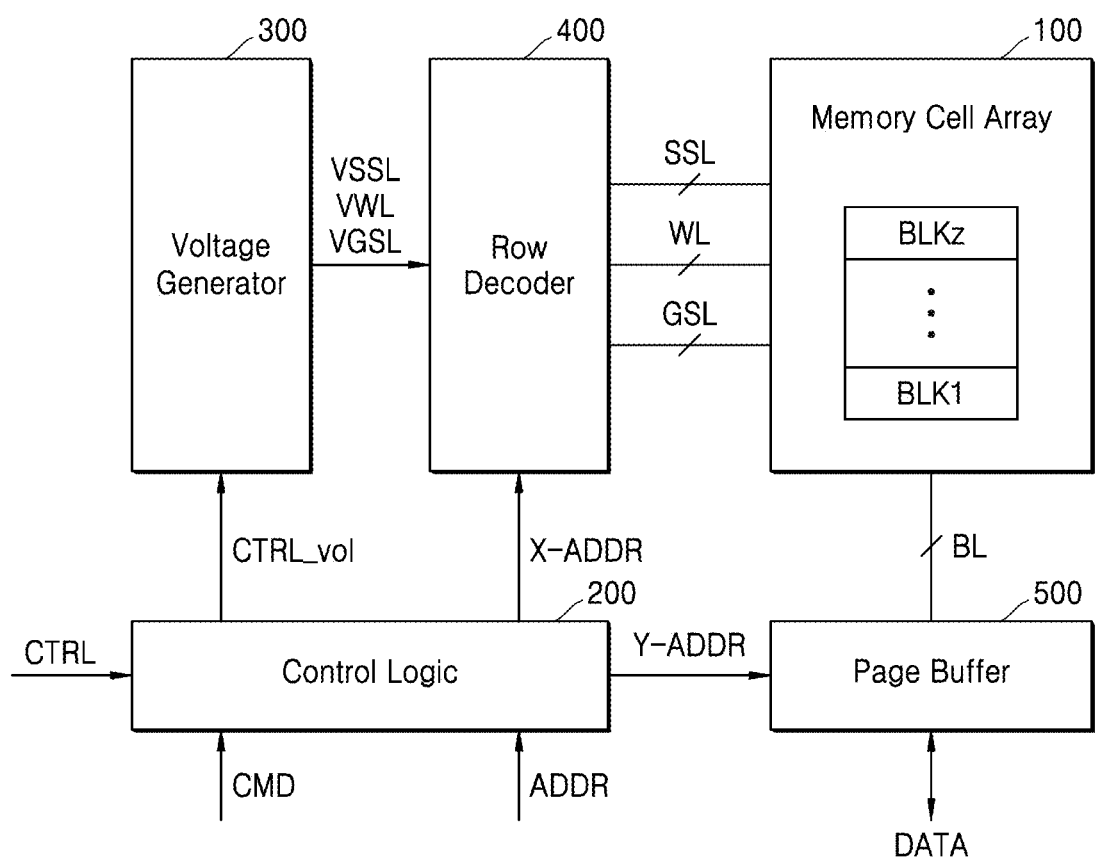
FIG. 1 is a block diagram illustrating a memory device in detail, according to some example embodiments of inventive concepts.
Figure 2:
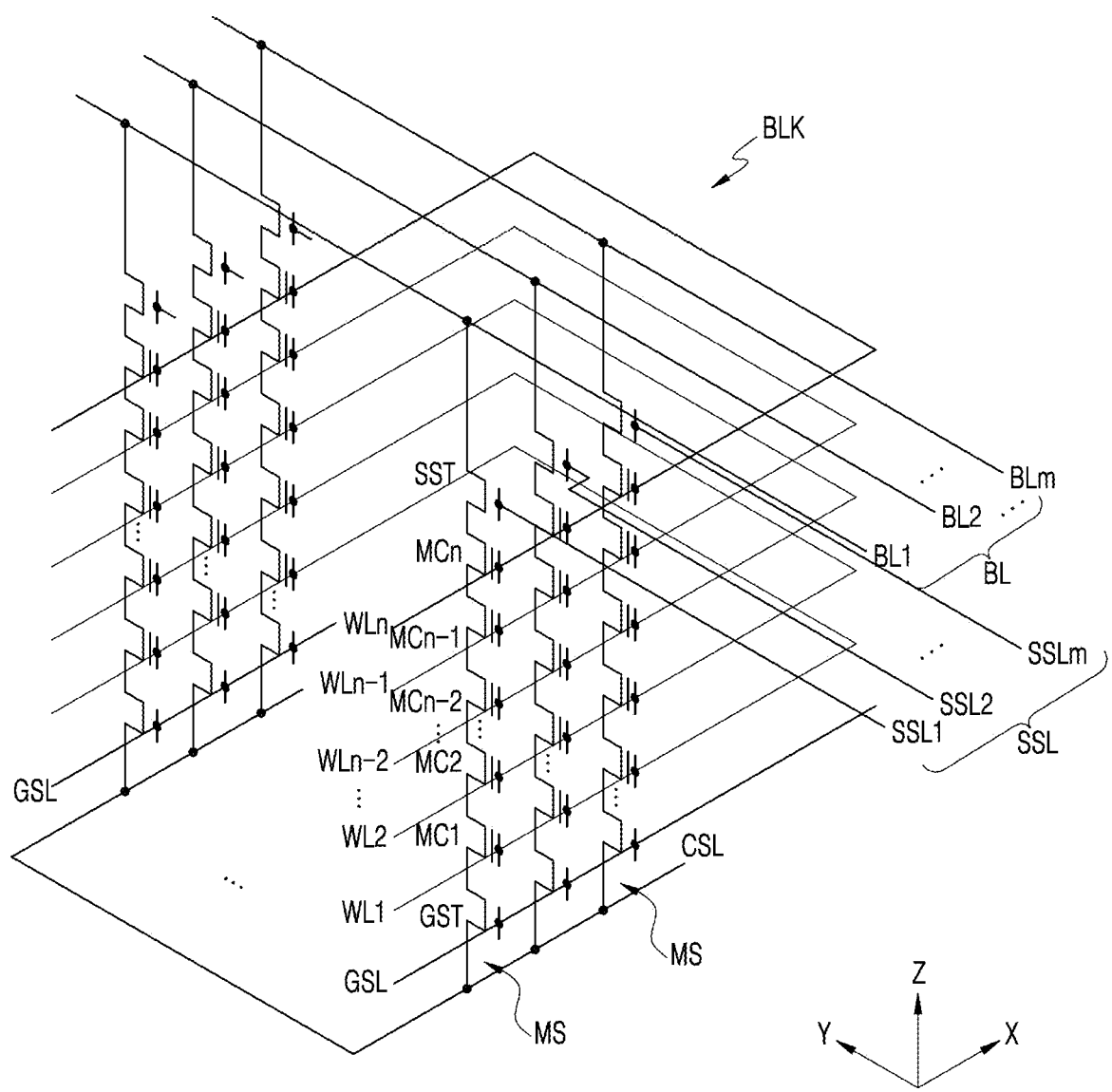
FIG. 2 is an equivalent circuit diagram of a memory block included in a memory cell area of a memory device, according to some example embodiments of inventive concepts.

FIG. 1 is a block diagram illustrating a memory device in detail, according to some example embodiments of inventive concepts. FIG. 2 is an equivalent circuit diagram of a memory block included in a memory cell area of a memory device, according to some example embodiments of inventive concepts.

Referring to FIG. 1, a vertical memory device 10 may include a memory cell array 100, a control logic 200, a voltage generator 300, a row decoder 400, and a page buffer 500.

The memory cell array 100 may include a plurality of memory cells and may be connected to a plurality of word lines WL, a plurality of string select lines SSL, a plurality of ground select lines GSL, a common source line, and a plurality of bit lines BL. The memory cell array 100 may be connected to the row decoder 400 via/through the plurality of word lines WL, the plurality of string select lines SSL, and the plurality of ground select lines GSL and may be connected to the page buffer 500 via/through the plurality of bit lines BL. In some example embodiments, the bit lines BL may extend in a horizontal direction (for example, a Y-axis direction or a column direction) parallel to a main surface of a substrate.

In some example embodiments, the memory device 10 may be or include a flash memory device, and the memory cell array 100 may include a plurality of NAND strings (referred to as "cell strings" hereinafter). Each of the cell strings may form a channel in a vertical direction, and a plurality of cell strings may be provided apart from each other by as much as a certain distance in an X-axis direction and in the Y-axis direction. The memory device 10 may include a word line structure in which the plurality of word lines WL are stacked, and the cell strings may be formed in channel structures formed through the word line structure in a vertical direction (for example, a Z-axis direction).

The memory cell array 100 may include a plurality of memory blocks BLK1 to BLKz. For example, each of the plurality of memory blocks BLK1 to BLKz may have a 3-dimensional structure, or a vertical structure. A circuit diagram of a plurality of memory blocks included in the memory cell array 100 will be described below with reference to FIG. 2.

The memory blocks BLK1 to BLKz may be selected by the row decoder 400. For example, the row decoder 400 may select a memory block corresponding to a block address from among the memory blocks BLK1 to BLKz. In some example embodiments, an erase operation may be performed on the basis of each of the memory blocks BLK1 to BLKz.

Referring to FIG. 2, a memory block BLK included in the memory cell array 100 may be or correspond to one of the plurality of memory blocks BLK1 to BLKz. The memory block BLK may include a plurality of memory cell strings MS. The memory block BLK may include bit lines BL1 to BLm, word lines WL1 to WLn, string select lines SSL1 to SSLm, at least one ground select line GSL, and a common source line CSL. The bit lines BL1 to BLm may be or correspond to at least some of the plurality of bit lines BL of FIG. 1, the word lines WL1 to WLn may be or correspond to at least some of the plurality of word lines WL of FIG. 1, and the string select lines SSL1 to SSLm may be at least some of the plurality of string select lines SSL of FIG. 1. The plurality of memory cell strings MS may be formed between the bit lines BL1 to BLm and the common source line CSL.

Each of the plurality of memory cell strings MS may include a string select transistor SST, a ground select transistor GST, and a plurality of memory cell transistors MC1 to MCn. A drain region of the string select transistor SST may be connected to the bit lines BL, and a source region of the ground select transistor GST may be connected to the common source line CSL. The common source line CSL may be or correspond to a region to which source regions of a plurality of ground select transistors GST are commonly connected.

To independently control each of the plurality of memory cell strings MS, the string select transistor SST included in each of the plurality of memory cell strings MS may be connected to a different string select line. For example, the string select transistor SST may be connected to a string select line (for example, one of SSL1, SSL2, and SSL3)

The ground select transistor GST may be connected to a ground select line GSL. In some example embodiments, although different ground select transistors GST included in the plurality of memory cell strings MS of the memory block BLK may be connected to the same ground select line GSL, example embodiments are not limited thereto, and the ground select transistors GST may be connected to different ground select lines GSL.

The plurality of memory cell transistors MC1 to MCn may be respectively connected to the plurality of word lines WL1 to WLn. The plurality of memory cell transistors MC1 to MCn constituting/corresponding to a memory cell string MS in the memory block BLK may be connected to each other in series in the Z-axis direction that is perpendicular to the main surface of the substrate.

Referring again to FIG. 1, the control logic 200 may control various components included in the memory device 10. The control logic 200 may output various internal control signals for programming data into the memory cell array 100 or reading data from the memory cell array 100, based on a command CMD, an address ADDR, and a control signal CTRL, which are received from a memory controller outside the memory device 10. For example, the control logic 200 may output a voltage control signal CTRL_vol for controlling levels of various voltages generated by the voltage generator 300. The control logic 200 may provide a row address X-ADDR to the row decoder 400 and may provide a column address Y-ADDR to the page buffer 500.

The voltage generator 300 may generate various voltages used in the memory device 10, for example, a word line voltage VWL, a string select line voltage VSSL, and/or a ground select line voltage VGSL. Alternatively or additionally, the voltage generator 300 may generate a common source line voltage, and a substrate voltage applied to the substrate on which the memory cell array 100 is formed.

The row decoder 400 may select at least one of word lines of a selected memory block, in response to the row address X-ADDR. In some example embodiments, during a pre-program operation, the row decoder 400 may apply the word line voltage VWL to at least one of the plurality of word lines WL, in response to the row address X-ADDR.

The page buffer 500 may operate as a write driver and/or a sense amplifier. For example, during a program operation, the page buffer 500 may transfer, to the bit lines BL, a voltage corresponding to data to be programmed. Alternatively or additionally, during a read operation, the page buffer 500 may sense, through the bit lines BL, data stored in a selected memory cell and transfer the data to an input/output buffer. The input/output buffer may transfer data input thereto to the page buffer 500 or may output data provided from the page buffer 500 to the outside of the memory device 10.

In the memory device 10 according to inventive concepts, contacts connecting channel structures to the bit lines BL may be arranged, e.g. may have a layout arranged by taking into account parasitic capacitances generated between the channel structures according to an arrangement of the channel structures forming a cell string. Accordingly, electrical characteristics of the respective bit lines BL which may be caused by the parasitic capacitances between the channel structures connected to each of the bit lines BL may be uniform or substantially uniform therebetween.

Figure 3:
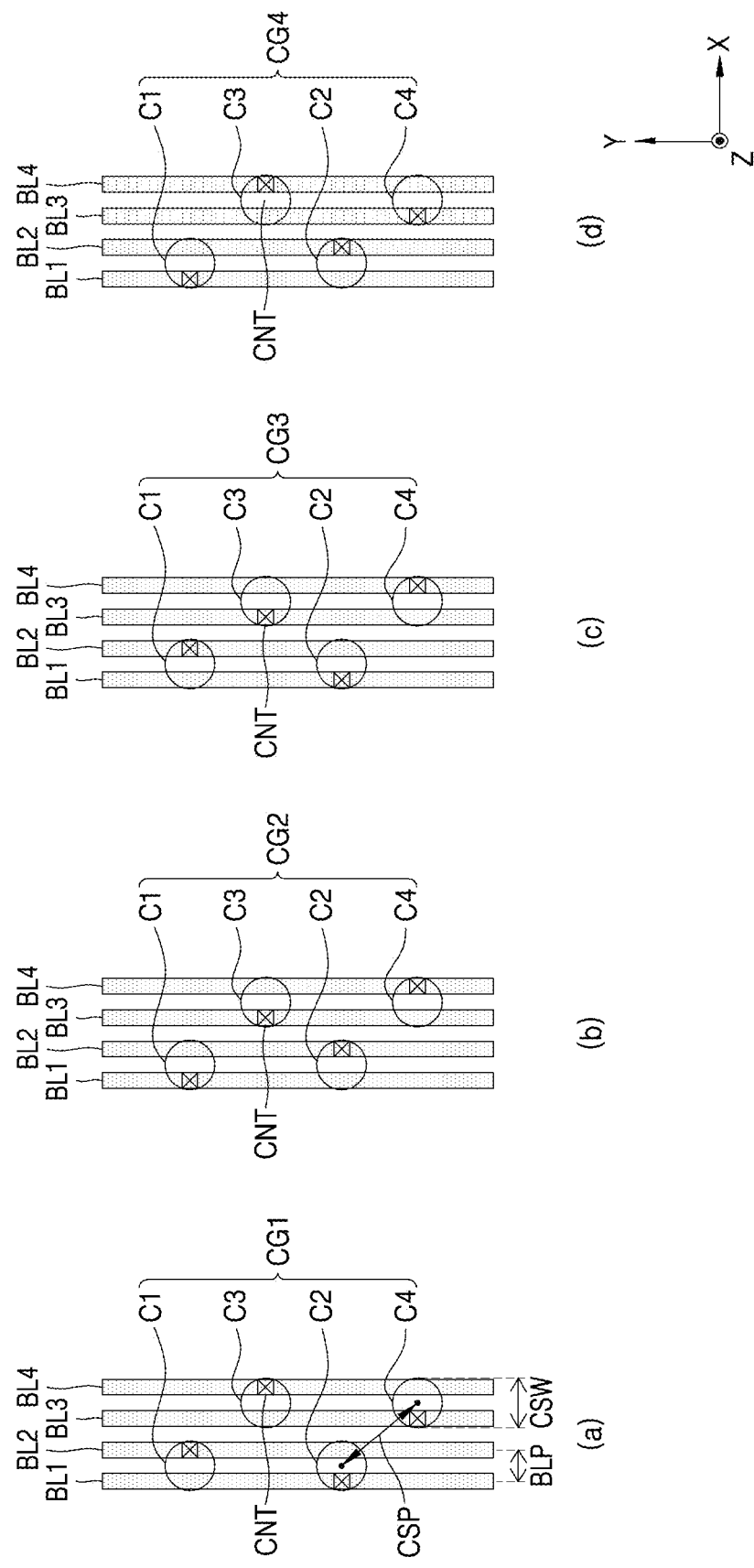
FIG. 3 shows diagrams each illustrating both an arrangement of a channel structure and an arrangement of contacts connecting bit lines to the channel structure, in a memory device according to inventive concepts.

FIG. 3 shows diagrams each illustrating both an arrangement of a channel structure and an arrangement of contacts connecting bit lines to the channel structure, in a memory device according to inventive concepts.

Referring to FIG. 3, a plurality of channel structures may include first to fourth channel structures C1 to C4 electrically connected to first to fourth bit lines BL1 to BL4. The plurality of channel structures may be arranged in a honeycomb structure, e.g. in a hexagonal or regular hexagonal structure. For example, the plurality of channel structures may be arranged in a zigzag manner. The first channel structure C1 and the second channel structure C2 may be arranged in alignment with each other in the Y-axis direction, and the third channel structure C3 and the fourth channel structure C4 may be arranged in alignment with each other in the Y-axis direction. In some example embodiments, although a reference distance CSP, which is a distance between channel structures arranged closest to each other, may be greater than a width or diameter CSW of each of the plurality of channel structures, the memory device according to inventive concepts is not limited thereto.

A plurality of bit lines, for example, first to fourth bit lines BL1 to BL4, may be arranged over the plurality of channel structures to extend in the Y-axis direction and may be apart from each other in the X-axis direction. In some example embodiments, a pitch or gap BLP between the first to fourth bit lines BL1 to BL4 may be less than the diameter or width CSW of each of the plurality of channel structures. In some example embodiments, two or more bit lines may be arranged over one channel structure to overlap the one channel structure in the Z-axis direction. For example, the first bit line BL1 and the second bit line BL2 may be arranged over the first channel structure C1 and the second channel structure C2, and each of the first channel structure C1 and the second channel structure C2 may be connected to a corresponding one of the first bit line BL1 and the second bit line BL2. Alternatively, for example, the third bit line BL3 and the fourth bit line BL4 may be arranged over the third channel structure C3 and the fourth channel structure C4, and each of the third channel structure C3 and the fourth channel structure C4 may be connected to a corresponding one of the third bit line BL3 and the fourth bit line BL4.

The first to fourth channel structures C1 to C4 may be electrically connected to the first to fourth bit lines BL1 to BL4 via or through a plurality of contacts CNT. There are at least four possible methods for connecting each of the four channel structures, that is, each of the first to fourth channel structures C1 to C4, to a corresponding bit line from among the first to fourth bit lines BL1 to BL4, and there are also at least four possible methods for arranging the plurality of contacts CNT.

Referring to FIG. 3(a), the plurality of contacts CNT may be arranged in a first layout/arrangement structure CG1. For example, in the first arrangement structure CG1 of the plurality of contacts CNT, the first channel structure C1 may be connected to the second bit line BL2, the second channel structure C2 may be connected to the first bit line BL1, the third channel structure C3 may be connected to the fourth bit line BL4, and the fourth channel structure C4 may be connected to the third bit line BL3.

Referring to FIG. 3(b), the plurality of contacts CNT may be arranged in a second layout/arrangement structure CG2. For example, in the second arrangement structure CG2 of the plurality of contacts CNT, the first channel structure C1 may be connected to the first bit line BL1, the second channel structure C2 may be connected to the second bit line BL2, the third channel structure C3 may be connected to the third bit line BL3, and the fourth channel structure C4 may be connected to the fourth bit line BL4.

Referring to FIG. 3(c), the plurality of contacts CNT may be arranged in a third layout/arrangement structure CG3. In the third arrangement structure CG3 of the plurality of contacts CNT, the first channel structure C1 may be connected to the second bit line BL2, the second channel structure C2 may be connected to the first bit line BL1, the third channel structure C3 may be connected to the third bit line BL3, and the fourth channel structure C4 may be connected to the fourth bit line BL4.

Referring to FIG. 3(d), the plurality of contacts CNT may be arranged in a fourth layout/arrangement structure CG4. In the fourth arrangement structure CG4 of the plurality of contacts CNT, the first channel structure C1 may be connected to the first bit line BL1, the second channel structure C2 may be connected to the second bit line BL2, the third channel structure C3 may be connected to the fourth bit line BL4, and the fourth channel structure C4 may be connected to the third bit line BL3.

Each of the plurality of channel structures may have various magnitudes of/amounts of parasitic capacitances caused by other channel structures arranged adjacent thereto. Each of the plurality of channel structures may have an increasing magnitude of parasitic capacitance with an increasing number of other channel structures arranged adjacent thereto and with decreasing distances from other channel structures arranged adjacent thereto. Accordingly, to uniformly or more uniformly manage electrical characteristics caused to the respective plurality of bit lines due to the parasitic capacitance of each of the plurality of channel structures, in the memory device according to inventive concepts, the plurality of contacts CNT connecting the plurality of channel structures to the plurality of bit lines may be arranged by taking into account the arrangement of the plurality of channel structures. For the channel structures formed in the memory cell array, the contacts CNT having at least one of the first to fourth arrangement structures CG1 to CG4 shown in FIGS. 3(A) to 3(D) may be selectively formed.

Figure 4:
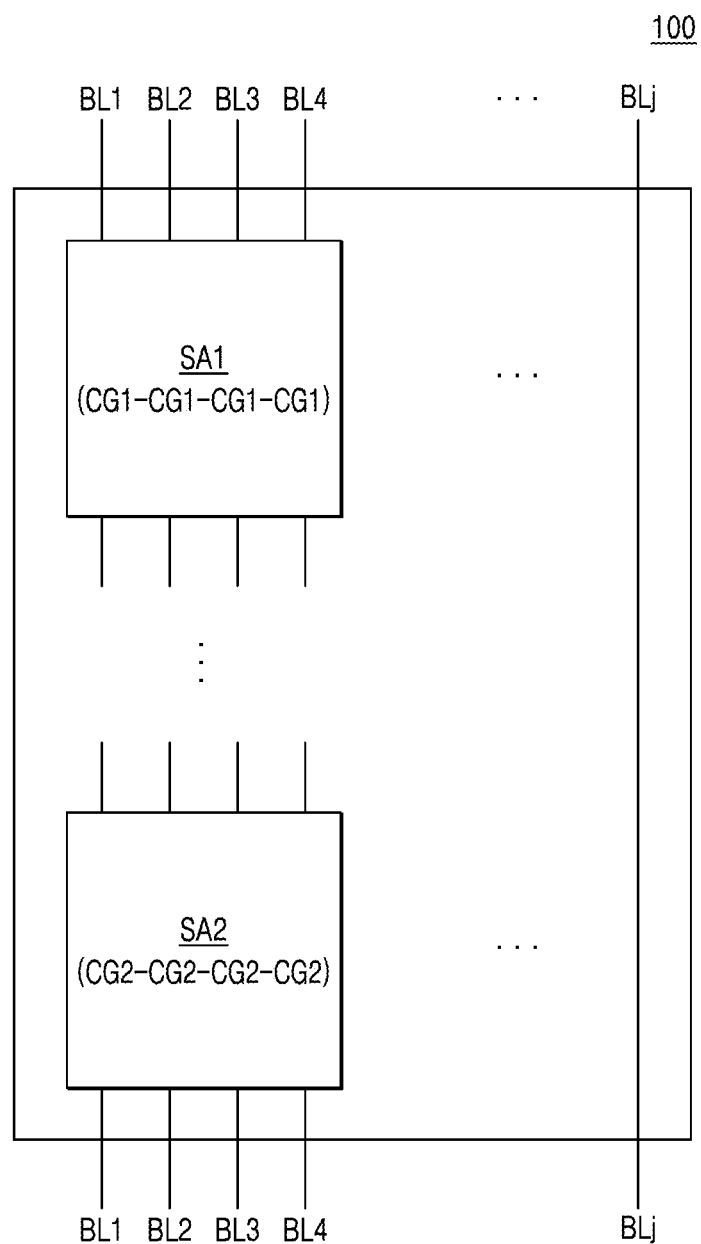
FIG. 4 is a diagram illustrating a memory cell array of a memory device, according to some example embodiments of inventive concepts.

FIG. 4 is a diagram illustrating a memory cell array of a memory device, according to some example embodiments of inventive concepts.

Referring to FIG. 4, the memory cell array 100 may be connected to a plurality of bit lines BL1 to BLj (for example, BL of FIG. 1). The memory cell array 100 may include a plurality of sub-arrays partitioned by a plurality of word line cuts. For example, the memory cell array 100 may include sub-arrays partitioned by the plurality of word line cuts and connected to first to fourth bit lines BL1 to BL4, and the sub-arrays may include a first sub-array SA1 and a second sub-array SA2. Although FIG. 4 illustrates only the first sub-array SA1 and the second sub-array SA2 for convenience of description, the memory cell array 100 may further include sub-arrays connected to other bit lines BL5 to BLj, and sub-arrays other than the first sub-array SA1 and the second sub-array SA2 may be alternatively or additionally connected to the first to fourth bit lines BL1 to BL4.

In some example embodiments, the first sub-array SA1 and the second sub-array SA2 may be arranged adjacent to each other. Alternatively, in some example embodiments, the first sub-array SA1 and the second sub-array SA2 may be apart from each other by arranging another sub-array between the first sub-array SA1 and the second sub-array SA2.

In some example embodiments, the first sub-array SA1 and the second sub-array SA2 may be different from each other in an arrangement structure of contacts that connect channel structures to the first to fourth bit lines BL1 to BL4. For example, the contacts having the first arrangement structure CG1 of FIG. 3, e.g. FIG. 3(a), may be formed in the first sub-array SA1, and the contacts having the second arrangement structure CG2 of FIG. 3, e.g. FIG. 3(b), may be formed in the second sub-array SA2. Because the arrangement structure of the contacts in the first sub-array SA1 is different from the arrangement structure of the contacts in the second sub-array SA2, differences in electrical characteristics between the first to fourth bit lines BL1 to BL4 due to differences in parasitic capacitance between the channel structures included in the first sub-array SA1 may be canceled out by using differences in parasitic capacitance between the channel structures included in the second sub-array SA2. Accordingly, electrical characteristics of the first to fourth bit lines BL1 to BL4 may be uniform or more uniform therebetween.

However, the memory cell array 100 according to inventive concepts is not limited to including the first sub-array SA1, which includes the contacts having the first arrangement structure CG1, and the second sub-array SA2, which includes the contacts having the second arrangement structure CG2. The memory cell array 100 according to inventive concepts may include a particular sub-array that includes contacts having at least one arrangement structure selected from the first to fourth arrangement structures CG1 to CG4 of FIG. 3, and may include another sub-array for canceling out differences in parasitic capacitance between channel structures included in the particular sub-array.

Figure 5:
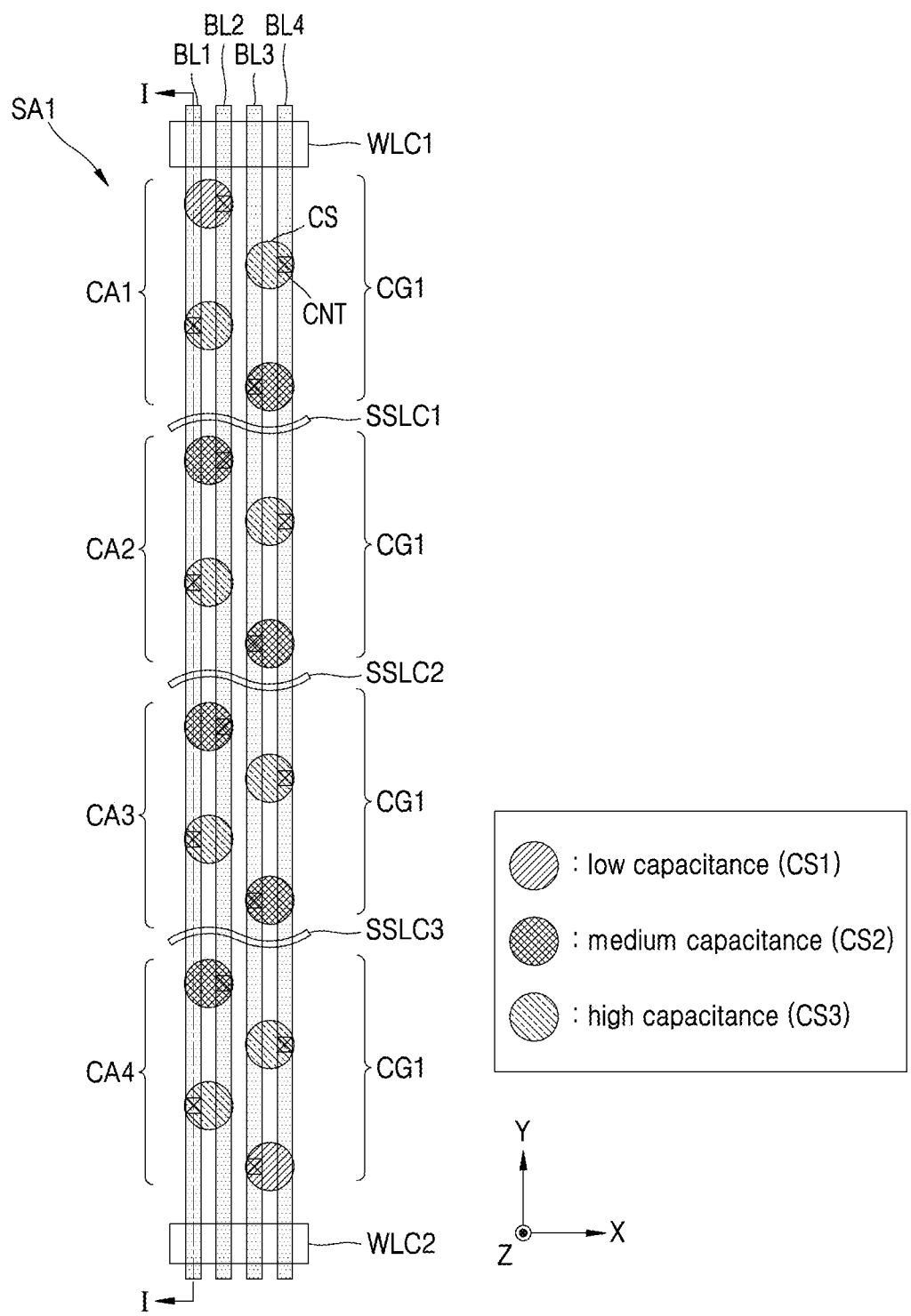
FIG. 5 is a plan view illustrating a memory device according to inventive concepts.
Figure 6:
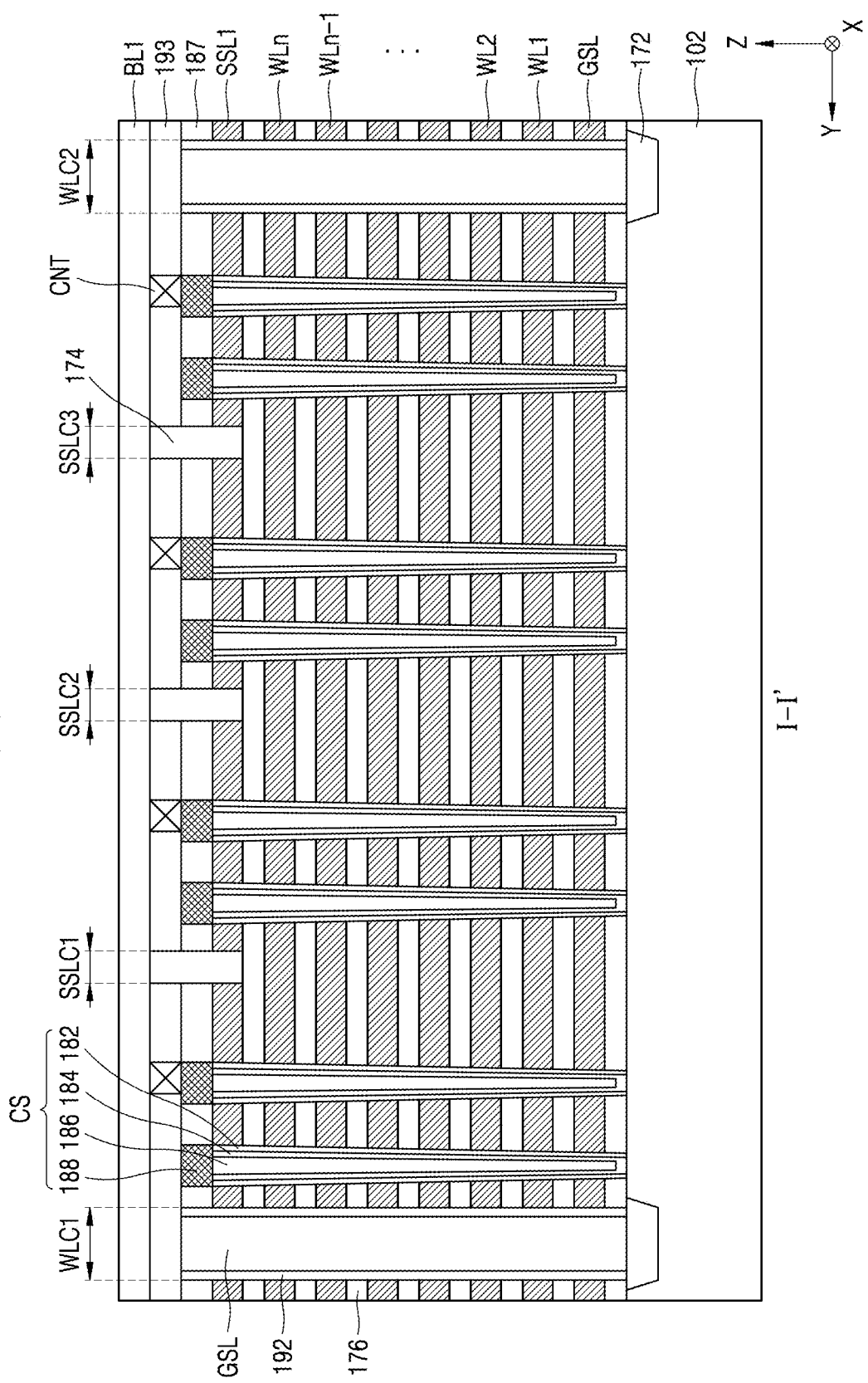
FIG. 6 is a cross-sectional view of the memory device of FIG. 5, taken along a line I-I' of FIG. 5.

FIG. 5 is a plan view illustrating a memory device according to inventive concepts and is for explaining the first sub-array of FIG. 4. FIG. 6 is a cross-sectional view of the memory device of FIG. 5, taken along a line I-I' of FIG. 5.

Referring to FIG. 5, in the first sub-array SA1, a word line cut region WLC1 may be formed at a boundary in the Y-axis direction, and a word line cut region WLC2 may be formed at a boundary in an opposite direction to the Y-axis direction. The first sub-array SA1 may be defined by the word line cut regions WLC1 and WLC2 and may be separated from other sub-arrays.

The first sub-array SA1 may include a plurality of channel structures CS. The plurality of channel structures CS may be arranged in a honeycomb structure, e.g. a regular or irregular honeycomb structure, e.g. an irregular hexagonal structure or regular hexagonal structure.

The first sub-array SA1 may include first to fourth channel groups CA1 to CA4. An arrangement structure of a plurality of channel structures CS included in the first channel group CA1 may be consistent with that obtained by shifting, in the Y-axis direction, the arrangement structure of the plurality of channel structures CS included in the second channel group CA2. Alternatively or additionally, the arrangement structure of the plurality of channel structures CS included in the second channel group CA2 may be consistent with that obtained by shifting, in the Y-axis direction, the arrangement structure of the plurality of channel structures CS included in the third channel group CA3, and the arrangement structure of the plurality of channel structures CS included in the third channel group CA3 may be consistent with that obtained by shifting, in the Y-axis direction, the arrangement structure of the plurality of channel structures CS included in the fourth channel group CA4.

A first select line cut region SSLC1 may be formed at a boundary between the first channel group CA1 and the second channel group CA2, a second select line cut region SSLC2 may be formed at a boundary between the second channel group CA2 and the third channel group CA3, and a third select line cut region SSLC3 may be formed at a boundary between the third channel group CA3 and the fourth channel group CA4. The first to fourth channel groups CA1 to CA4 may be defined by the word line cut regions WLC1 and WLC2, the first select line cut region SSLC1, the second select line cut region SSLC2, and the third select line cut region SSLC3.

In some example embodiments, the channel structures CS may not be formed in the first select line cut region SSLC1, the second select line cut region SSLC2, and the third select line cut region SSLC3, and the first select line cut region SSLC1, the second select line cut region SSLC2, and the third select line cut region SSLC3 may be apart from the channel structures CS.

Figure 24:
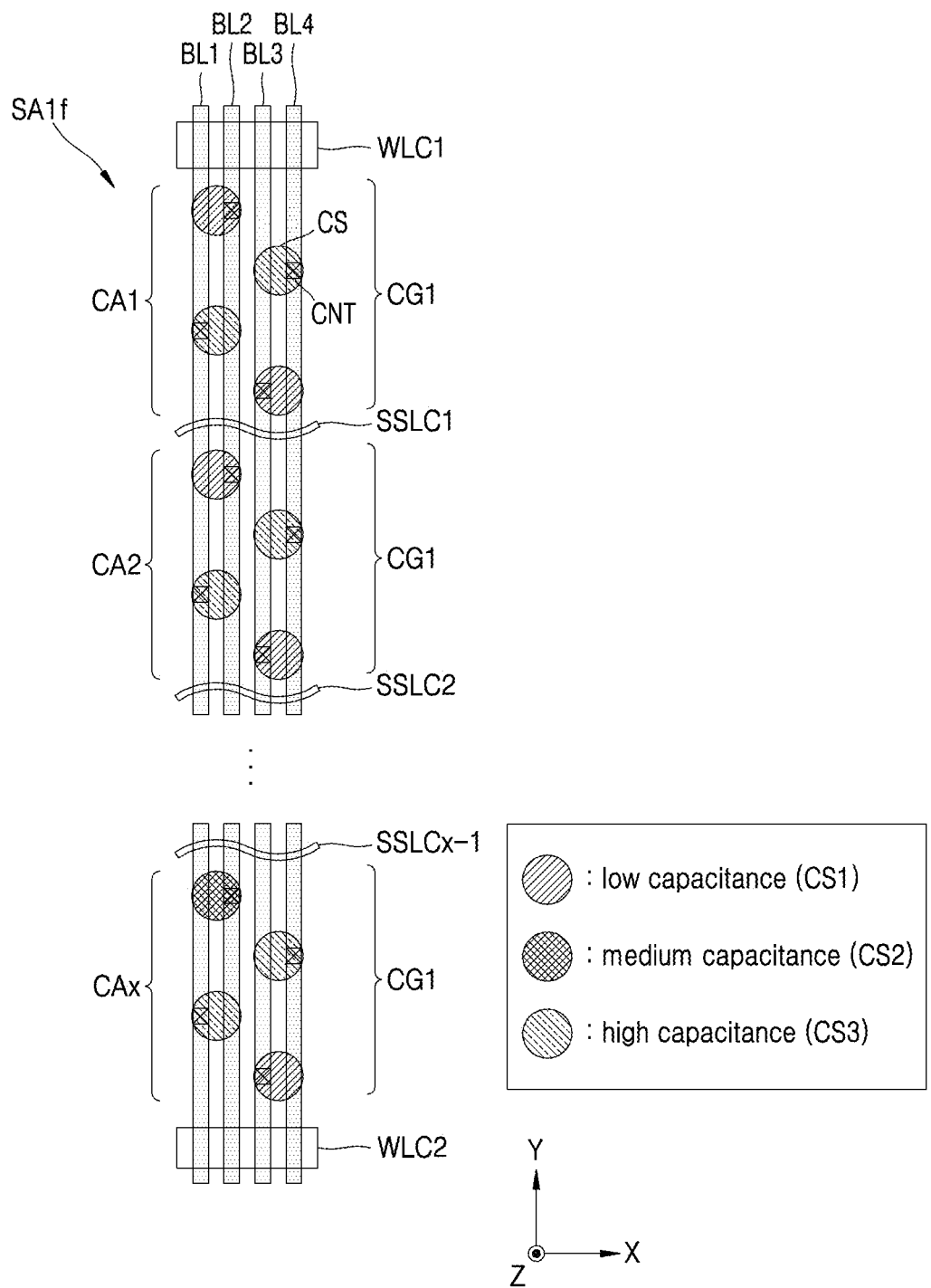
FIGS. 24 and 25 are each a plan view illustrating a memory device according to inventive concepts.

In some example embodiments, each of the first to third select line cut regions SSLC1 to SSLC3 may have a wave shape from a top/down perspective or from the viewpoint of a plane (for example, an X-Y plane) parallel to the main surface of the substrate to secure a certain distance from the channel structures CS. Although FIG. 5 illustrates an example in which three select line cut regions are formed in one sub-array, the memory device according to inventive concepts is not limited thereto. As shown in FIG. 24, the number of select line cut regions formed between the word line cut regions WLC1 and WLC2 may be variously changed, and the number of channel groups included in the first sub-array SA1 may also be variously changed.

The magnitude of parasitic capacitance of each of the plurality of channel structures CS may vary with the number of other channel structures adjacent thereto and/or distances from the other channel structures. The magnitude of parasitic capacitance of each of the plurality of channel structures CS may increase with the increasing number of the other channel structures adjacent thereto and/or with the decreasing distances from the other channel structures.

For example, first-type channel structures CS1 arranged closest to the word line cut regions WLC1 and WLC2 may be far away from other channel structures by as much as a certain distance or more due to the word line cut regions WLC1 and WLC2. A first parasitic capacitance of the first-type channel structures CS1 may be relatively small.

In addition, for example, a second parasitic capacitance of second-type channel structures CS2, which are arranged closest to one of the first select line cut region SSLC1, the second select line cut region SSLC2, and the third select line cut region SSLC3, may be greater than the first parasitic capacitance of the first-type channel structures CS1. Because word lines are not removed and string select lines are removed from the first select line cut region SSLC1, the second select line cut region SSLC2, and the third select line cut region SSLC3 and a width of each of the first select line cut region SSLC1, the second select line cut region SSLC2, and the third select line cut region SSLC3 may be less than a width of each of the word line cut regions WLC1 and WLC2, the second parasitic capacitance of the second-type channel structures CS2 may be greater than the first parasitic capacitances of the first-type channel structures CS1.

On the other hand, a third parasitic capacitance of third-type channel structures CS3, which are relatively far from the word line cut regions WLC1 and WLC2, the first select line cut region SSLC1, the second select line cut region SSLC2, and the third select line cut region SSLC3 and are surrounded by other channel structures, may be greater than the second parasitic capacitance of the second-type channel structures CS2.

Although FIG. 5 illustrates only the first sub-array SA1 connected to the first to fourth bit lines BL1 to BL4, another sub-array adjacent to the first sub-array SA1 in the X-axis direction may also include the plurality of channel structures CS, and another sub-array adjacent to the first sub-array SA1 in an opposite direction to the X-axis direction may also include the plurality of channel structures CS. Because the plurality of channel structures CS are arranged in a hexagonal/regular hexagonal/honeycomb structure, each of the first-type channel structures CS1 and the second-type channel structures CS2 may be arranged adjacent to two other channel structures by as much as a reference distance (for example, CSP of FIG. 3). On the other hand, each of the third-type channel structures CS3 may be arranged adjacent to four other channel structures by as much as the reference distance (for example, CSP of FIG. 3).

Each of the first to fourth bit lines BL1 to BL4 may be connected to one channel structure included in the first channel group CA1, one channel structure included in the second channel group CA2, one channel structure included in the third channel group CA3, and one channel structure included in the fourth channel group CA4 through/via the plurality of contacts CNT. In some example embodiments, in each of the first to fourth channel groups CA1 to CA4, the same contact group may be repeatedly formed. For example, in each of the first to fourth channel groups CA1 to CA4, the contacts CNT having the first arrangement structure CG1 may be formed. The first arrangement structure CG1 may refer to the same contact arrangement type as the first arrangement structure CG1 described with reference to FIG. 3.

Referring to FIGS. 5 and 6, a substrate 102 of the memory device may have a main surface extending in the X-axis direction and the Y-axis direction. In some example embodiments, the substrate 102 may include undoped or doped, e.g. lightly doped Si, Ge, or SiGe. In another example embodiment, the substrate 102 may include an undoped or doped, e.g. lightly doped, silicon-on-insulator (SOI) substrate or a germanium-on-insulator (GeOI) substrate.

A plurality of word lines WL1 to WLn may extend, over the substrate 102, in a horizontal direction parallel to the main surface of the substrate 102, that is, along the X-Y plane, and may be arranged apart from each other in a vertical direction (Z-axis direction) perpendicular to the main surface of the substrate 102 to overlap each other in the vertical direction.

The word line cut regions WLC1 and WLC2 may extend in the X-axis direction parallel to the main surface of the substrate 102. The word line cut regions WLC1 and WLC2 may define widths of the plurality of word lines WL1 to WLn in the Y-axis direction. The plurality of word lines WL1 to WLn may be repeatedly arranged at regular intervals to be apart from each other by the word line cut regions WLC1 and WLC2.

A plurality of common source regions 172 may extend, in the substrate 102, in the X-axis direction. In some example embodiments, the plurality of common source regions 172 may be or include impurity regions doped with n-type impurities such as phosphorus and/or arsenic at a high concentration. The plurality of common source regions 172 may function as source regions providing current to vertical memory cells.

An insulating spacer 192 and a common source line CSL may be formed in each of the word line cut regions WLC1 and WLC2. A plurality of common source lines CSL may extend in the X-axis direction on the plurality of common source regions 172. The plurality of common source lines CSL may be formed on one side of a pair of ground select lines GSL, the plurality of word lines WL1 to WLn, and a pair of string select lines SSL1 to partially fill the word line cut regions WLC1 and WLC2.

Between two adjacent word line cut regions WLC1 and WLC2, at least one ground select line GSL, the plurality of word lines WL1 to WLn, and at least one string select line SSL1 may be stacked, e.g. sequentially stacked in this stated order. Although FIG. 5 illustrates an example in which one ground select line GSL, the plurality of word lines WL1 to WLn, and one string select line SSL1 are sequentially stacked over the substrate 102 in the vertical direction, this is for convenience of description, and inventive concepts are not limited to the illustrated example. Two string select lines SSL1 adjacent in the Y-axis direction may be separated from each other by the first to third select line cut regions SSLC1 to SSLC3. The first to third select line cut regions SSLC1 to SSLC3 may define a width of the string select line SSL1 in the Y-axis direction. The first to third select line cut regions SSLC1 to SSLC3 may be filled with an insulating film 174. The insulating film 174 may include an oxide film, a nitride film, or a combination thereof. The first to third select line cut regions SSLC1 to SSLC3 may be at least partially filled with an air gap.

The at least one ground select line GSL, the plurality of word lines WL1 to WLn, and the at least one string select line SSL1 may each include a metal, a metal silicide, an impurity-doped semiconductor such as doped polysilicon, or a combination thereof. For example, the at least one ground select line GSL, the plurality of word lines WL1 to WLn, and the at least one string select line SSL1 may each include a metal such as tungsten, nickel, cobalt, or tantalum, a metal silicide such as tungsten silicide, nickel silicide, cobalt silicide, or tantalum silicide, impurity-doped polysilicon, or a combination thereof.

Between the substrate 102 and the at least one ground select line GSL, and between the at least one ground select line GSL, the plurality of word lines WL1 to WLn, and the at least one string select line SSL1, an insulating film 176 may be arranged. The insulating film 176 may include silicon oxide, silicon nitride, silicon oxynitride, or a combination thereof.

The plurality of channel structures CS may extend in the Z-axis direction through the at least one ground select line GSL, the plurality of word lines WL1 to WLn, the at least one string select line SSL1, and a plurality of insulating films 176. The plurality of channel structures CS may be arranged apart from each other by as much as certain intervals in the X-axis direction and the Y-axis direction.

Each of the plurality of channel structures CS may include a gate dielectric 182, a channel region 184, an insulating film 186, and a drain region 188. In some example embodiments, between the gate dielectric 182 and the ground select line GSL, between the gate dielectric 182 and the plurality of word lines WL1 to WLn, and between the gate dielectric 182 and the string select line SSL1, a barrier metal layer may be formed.

The channel region 184 may include doped polysilicon and/or un-doped polysilicon. The channel region 184 may have a cylinder shape, e.g. a tapering-cylinder shape. An inner space of the channel region 184 may be filled with the insulating film 186.

The insulating film 186 may include an insulating material. For example, the insulating film 186 may include silicon oxide, silicon nitride, silicon oxynitride, or a combination thereof. In some example embodiments, the insulating film 186 may be omitted, and in this case, the channel region 184 may have a pillar structure having no inner space.

The drain region 188 may include an impurity-doped polysilicon layer. A plurality of drain regions 188 may be insulated from each other by an insulating film 187. The insulating film 187 may include an oxide film, a nitride film, or a combination thereof.

Each drain region 188 may be connected to one corresponding first bit line BL1 from among the plurality of bit lines (for example, BL of FIG. 1) through/via the plurality of contacts CNT. The plurality of contacts CNT may be insulated from each other by an insulating film 193.

Figure 7:
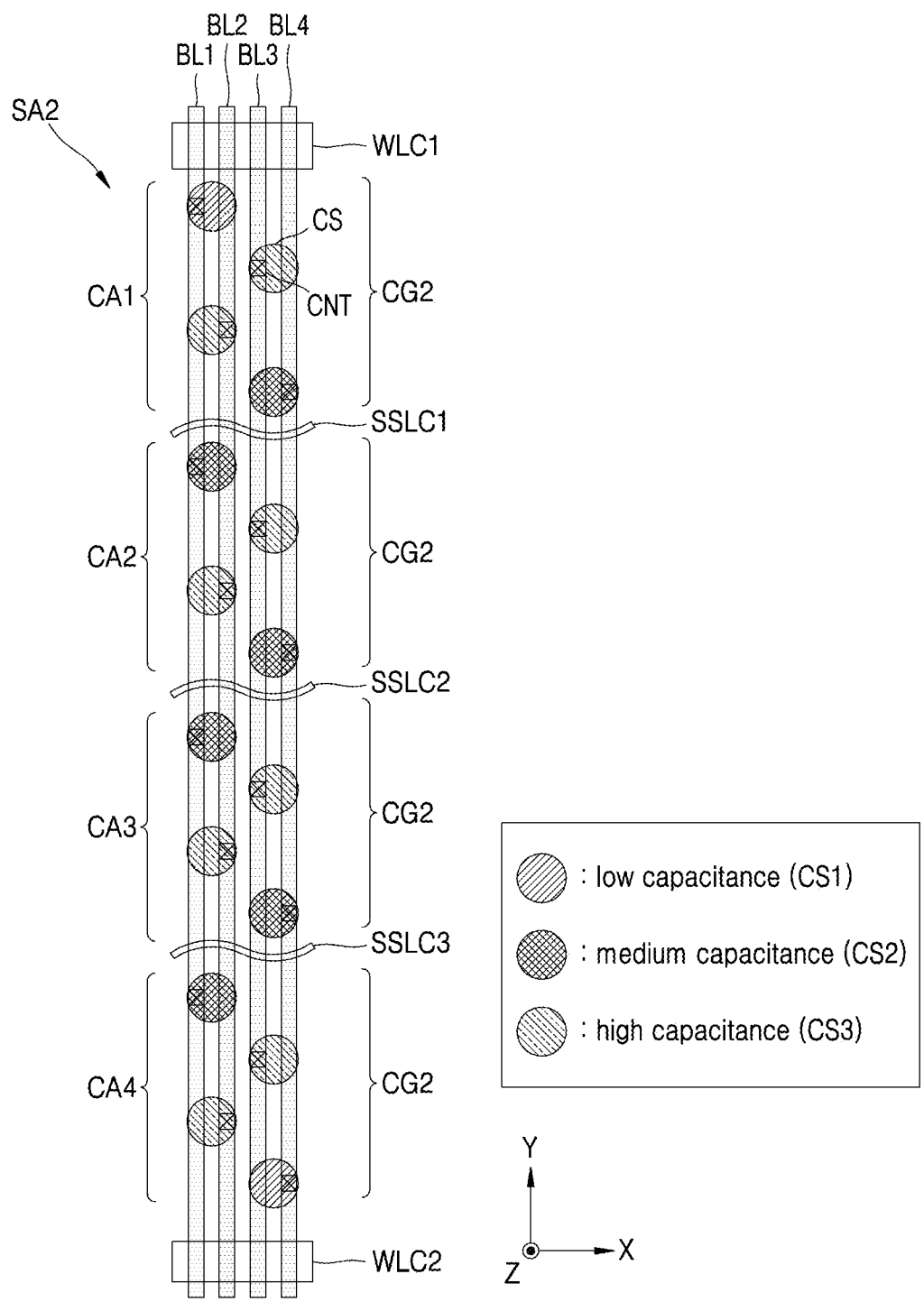
FIG. 7 is a plan view illustrating a memory device according to inventive concepts.

FIG. 7 is a plan view illustrating a memory device according to inventive concepts and is for explaining the second sub-array of FIG. 4. In descriptions regarding FIG. 7, repeated descriptions given with reference to FIG. 5 will be omitted.

Referring to FIG. 7, in the second sub-array SA2, the word line cut regions WLC1 and WLC2 may be respectively formed at a boundary in the Y-axis direction and a boundary in an opposite direction to the Y-axis direction. The second sub-array SA2 may be defined by the word line cut regions WLC1 and WLC2.

The second sub-array SA2 may include the first to fourth channel groups CA1 to CA4. The second sub-array SA2 may include the plurality of channel structures CS arranged in a honeycomb structure, e.g. a hexagonal structure or a regular-hexagonal structure.

Each of the first to fourth bit lines BL1 to BL4 may be connected to one channel structure included in the first channel group CA1, one channel structure included in the second channel group CA2, one channel structure included in the third channel group CA3, and one channel structure included in the fourth channel group CA4 through/via the plurality of contacts CNT.

The second sub-array SA2 may be different from the first sub-array SA1 of FIG. 5 in an arrangement of the contacts CNT. In some example embodiments, the contacts CNT having the second arrangement structure CG2 may be formed in each of the first to fourth channel groups CA1 to CA4. The second arrangement structure CG2 may refer to the same contact arrangement type as the second arrangement structure CG2 described with reference to FIG. 3.

FIG. 8 is a diagram illustrating parasitic capacitances of channel structures connected to each bit line of a memory device according to inventive concepts.

Referring to FIGS. 5 and 8, as the contacts CNT having the first arrangement structure CG1 are repeatedly arranged in each of the first to fourth channel groups CA1 to CA4, a contact arrangement structure of the first sub-array SA1 may be referred to as CG1-CG1-CG1-CG1.

To approximately calculate numbers corresponding to/related to/proportional to the parasitic capacitances, the first parasitic capacitance of the first-type channel structure CS1 may be defined as "1", the second parasitic capacitance of the second-type channel structure CS2 may be defined as "2", and the third parasitic capacitance of the third-type channel structure CS3 may be defined as "3". Unless explicitly disclosed herein, terms such as "first parasitic capacitance", "second parasitic capacitance", "third parasitic capacitance", etc. may represent numerical values in arbitrary units.

The third-type channel structure CS3 of the first channel group CA1, the third-type channel structure CS3 of the second channel group CA2, the third-type channel structure CS3 of the third channel group CA3, and the third-type channel structure CS3 of the fourth channel group CA4 may be connected to each of the first bit line BL1 and the fourth bit line BL4. Accordingly, a sum of parasitic capacitances of the channel structures CS of the first sub-array SA1, which are connected to each of the first bit line BL1 and the fourth bit line BL4, may be or be proportional to "3+3+3+3=12".

Alternatively or additionally, the first-type channel structure CS1 of the first channel group CA1, the second-type channel structure CS2 of the second channel group CA2, the second-type channel structure CS2 of the third channel group CA3, and the second-type channel structure CS2 of the fourth channel group CA4 may be connected to the second bit line BL2. Accordingly, the sum of the parasitic capacitances of the channel structures CS of the first sub-array SA1, which are connected to the second bit line BL2, may be or may be proportional to "1+2+2+2=7".

On the other hand, the second-type channel structure CS2 of the first channel group CA1, the second-type channel structure CS2 of the second channel group CA2, the second-type channel structure CS2 of the third channel group CA3, and the first-type channel structure CS1 of the fourth channel group CA4 may be connected to the third bit line BL3. Accordingly, the sum of the parasitic capacitances of the channel structures CS of the first sub-array SA1, which are connected to the third bit line BL3, may be or be proportional to "2+2+2+1=7".

Referring to FIGS. 7 and 8, as the contacts CNT having the second arrangement structure CG2 are repeatedly arranged in each of the first to fourth channel groups CA1 to CA4, a contact arrangement structure of the second sub-array SA2 may be referred to as CG2-CG2-CG2-CG2.

The third-type channel structure CS3 of the first channel group CA1, the third-type channel structure CS3 of the second channel group CA2, the third-type channel structure CS3 of the third channel group CA3, and the third-type channel structure CS3 of the fourth channel group CA4 may be connected to each of the second bit line BL2 and the third bit line BL3. Accordingly, the sum of the parasitic capacitances of the channel structures CS of the second sub-array SA2, which are connected to each of the second bit line BL2 and the third bit line BL3, may be or may be proportional to "3+3+3+3=12".

Alternatively or additionally, the first-type channel structure CS1 of the first channel group CA1, the second-type channel structure CS2 of the second channel group CA2, the second-type channel structure CS2 of the third channel group CA3, and the second-type channel structure CS2 of the fourth channel group CA4 may be connected to the first bit line BL1. Accordingly, the sum of the parasitic capacitances of the channel structures CS of the second sub-array SA2, which are connected to the first bit line BL1, may be or may be proportional to "1+2+2+2=7".

On the other hand, the second-type channel structure CS2 of the first channel group CA1, the second-type channel structure CS2 of the second channel group CA2, the second-type channel structure CS2 of the third channel group CA3, and the first-type channel structure CS1 of the fourth channel group CA4 may be connected to the fourth bit line BL4. Accordingly, the sum of the parasitic capacitances of the channel structures CS of the second sub-array SA2, which are connected to the fourth bit line BL4, may be or may be proportional to "2+2+2+1=7".

Referring to FIGS. 4 and 8, assuming that all sub-arrays connected to the first to fourth bit lines BL1 to BL4 include the contacts CNT arranged in the type of CG1-CG1-CG1-CG1, the first bit line BL1 and the fourth bit line BL4 may have bit line loads that are greater than those of the second bit line BL2 and the third bit line BL3, and electrical characteristics may vary for each bit line.

The memory cell array 100 of the memory device according to inventive concepts includes sub-arrays (for example, the first sub-array SA1 and the second sub-array SA2), which are different from each other in an arrangement structure of contacts that connect channel structures to bit lines corresponding to the channel structures, whereby parasitic capacitances of the channel structures connected to each bit line may be maintained uniform, and electrical characteristics may be uniform for each bit line.

The arrangement of the contacts CNT formed in the first sub-array SA1 shown in FIG. 5 and the arrangement of the contacts CNT formed in the second sub-array SA2 shown in FIG. 7 are merely examples according to inventive concepts, and the memory device according to inventive concepts is not limited thereto. In the memory device according to inventive concepts, the contacts having the first to fourth arrangement structures CG1 to CG4 of FIG. 3 may be variously formed in the memory cell array 100 for electrical characteristics of the bit lines BL1 to BLj to be uniform. For example, the memory cell array 100 may include a sub-array including the first to fourth channel groups CA1 to CA4, in which the contacts having the third arrangement structure CG3 are repeatedly arranged, or may include a sub-array including the first to fourth channel groups CA1 to CA4, in which the contacts having the fourth arrangement structure CG4 are repeatedly arranged.

Figure 9:
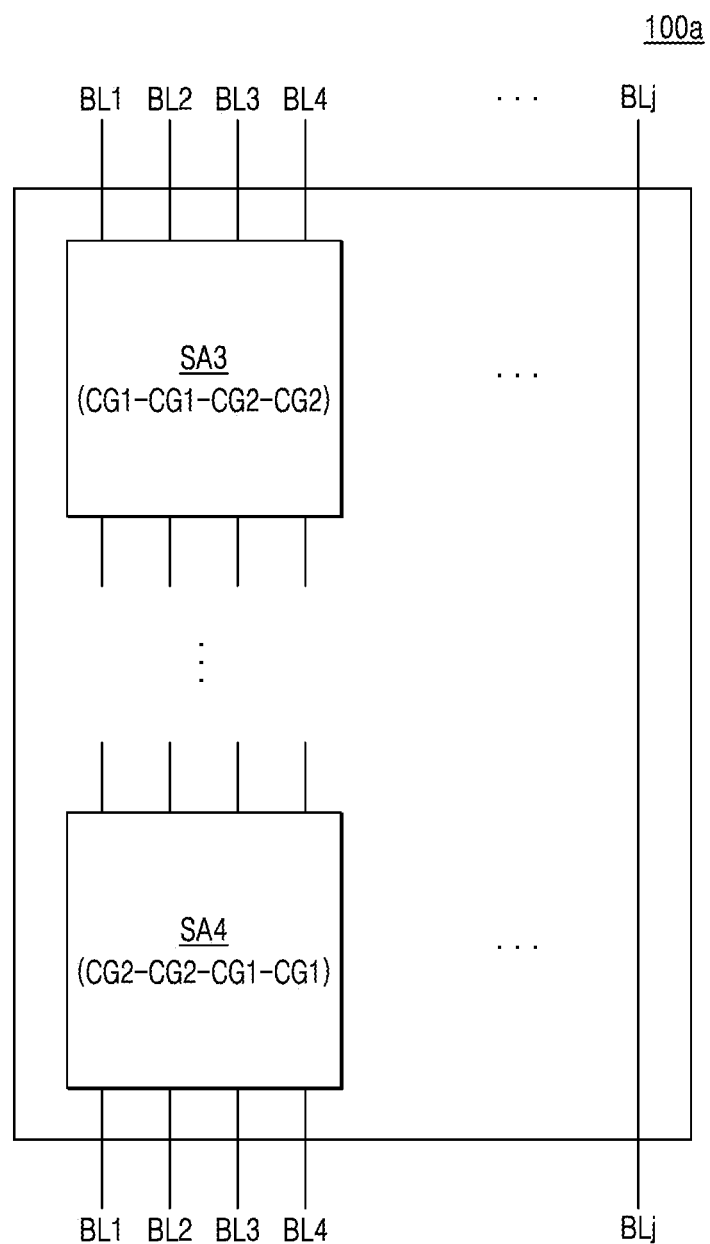
FIG. 9 is a diagram illustrating a memory cell array of a memory device, according to some example embodiments of inventive concepts.

FIG. 9 is a diagram illustrating a memory cell array of a memory device, according to some example embodiments of inventive concepts. In descriptions regarding FIG. 9, repeated descriptions given with reference to FIG. 4 will be omitted.

Referring to FIG. 9, a memory cell array 100a may include a third sub-array SA3 and a fourth sub-array SA4, which are defined by a plurality of word line cuts and connected to the first to fourth bit lines BL1 to BL4.

The contacts having the first arrangement structure CG1 and the second arrangement structure CG2 of FIG. 3 may be formed in each of the third sub-array SA3 and the fourth sub-array SA4. In some example embodiments, the third sub-array SA3 and the fourth sub-array SA4 may be different from each other in an arrangement structure of contacts that connect channel structures to the first to fourth bit lines BL1 to BL4. Differences between bit line loads caused to the first to fourth bit lines BL1 to BL4 due to differences in parasitic capacitance between the channel structures included in the third sub-array SA3 may be canceled out or substantially cancelled out by using differences in parasitic capacitance between the channel structures included in the fourth sub-array SA4. The bit line loads respectively occurring in the first to fourth bit lines BL1 to BL4 due to the parasitic capacitances of the channel structures may be uniform therebetween.

Figure 10:
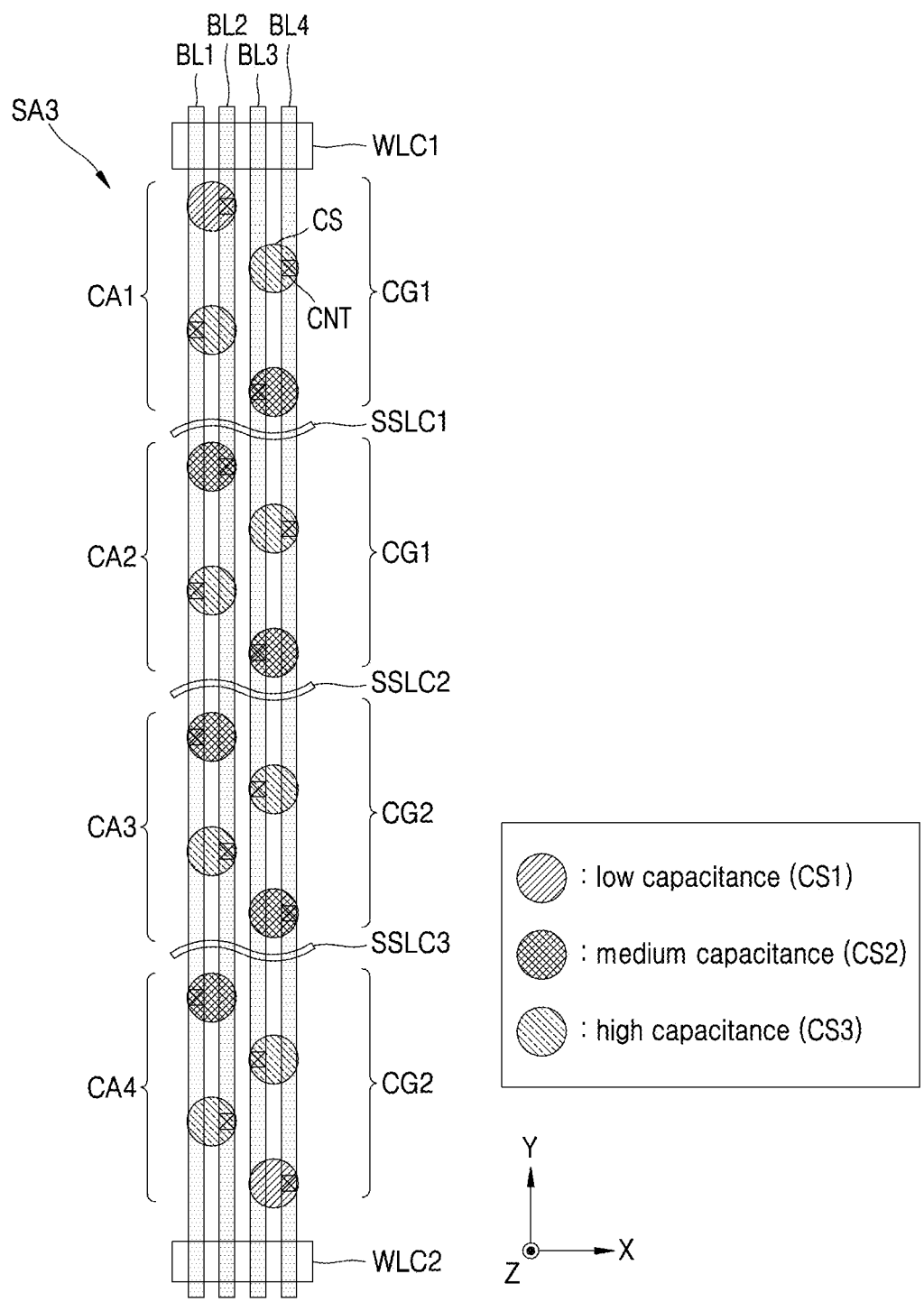
FIGS. 10 and 11 are each a plan view illustrating a memory device according to inventive concepts.
Figure 11:
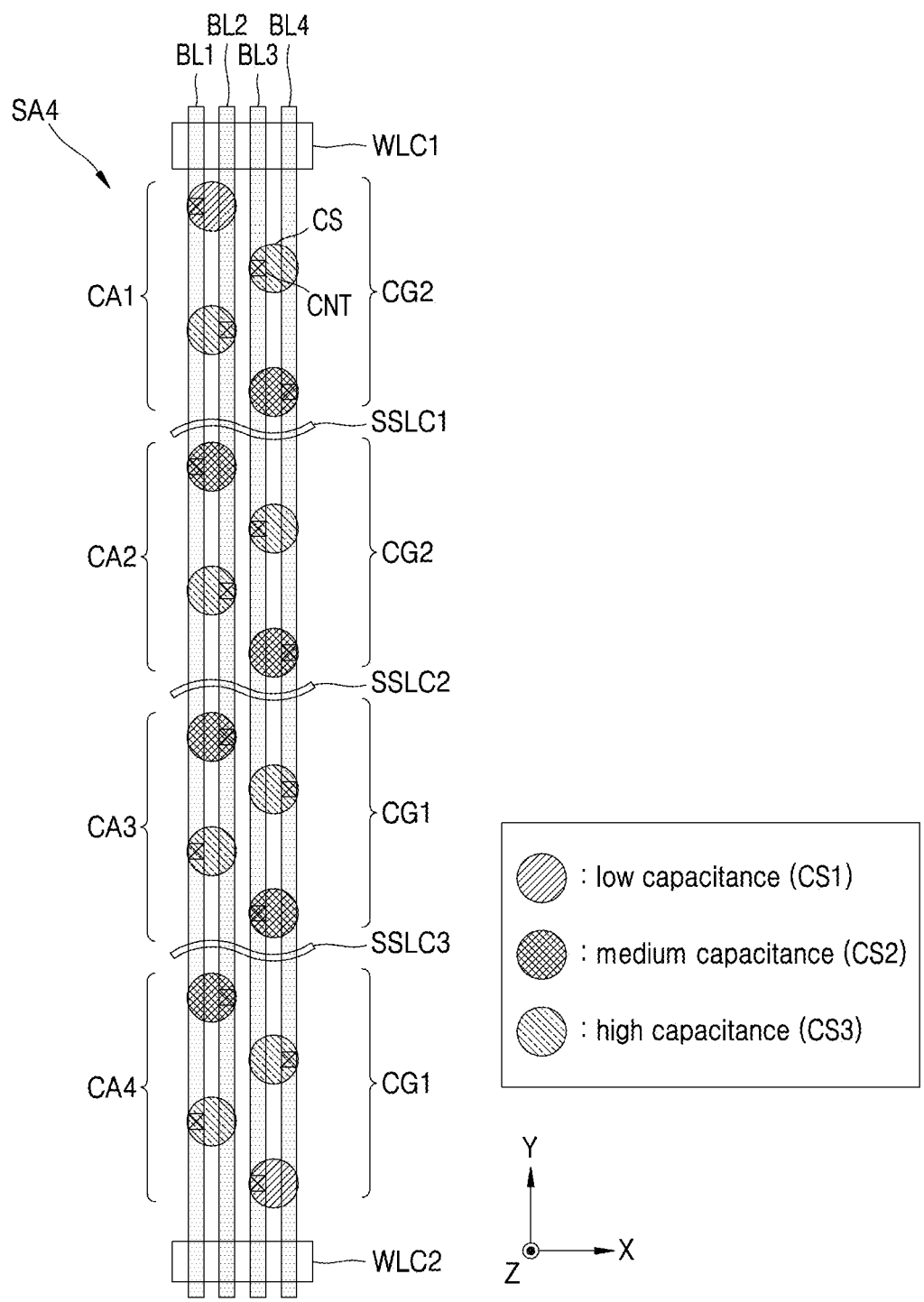

FIGS. 10 and 11 are each a plan view illustrating a memory device according to inventive concepts and are respectively for explaining the third sub-array and the fourth sub-array of FIG. 9. In descriptions regarding FIGS. 10 and 11, repeated descriptions given with reference to FIGS. 5 and 7 will be omitted.

Referring to FIG. 10, the third sub-array SA3 may be defined by the word line cut regions WLC1 and WLC2. The third sub-array SA3 may include the first to fourth channel groups CA1 to CA4 and may include the plurality of channel structures CS arranged in a honeycomb structure.

The contacts CNT having the first arrangement structure CG1, the contacts CNT having the first arrangement structure CG1, the contacts CNT having the second arrangement structure CG2, and the contacts CNT having the second arrangement structure CG2 may be respectively arranged in the first to fourth channel groups CA1 to CA4 of the third sub-array SA3 in this stated order. The first arrangement structure CG1 and the second arrangement structure CG2 may respectively refer to the same contact arrangement types as the first arrangement structure CG1 and the second arrangement structure CG2 described with reference to FIG. 3.

Referring to FIG. 11, the fourth sub-array SA4 may be defined by the word line cut regions WLC1 and WLC2. The fourth sub-array SA4 may include the first to fourth channel groups CA1 to CA4 and may include the plurality of channel structures CS arranged in a honeycomb structure.

The contacts CNT having the second arrangement structure CG2, the contacts CNT having the second arrangement structure CG2, the contacts CNT having the first arrangement structure CG1, and the contacts CNT having the first arrangement structure CG1 may be respectively arranged in the first to fourth channel groups CA1 to CA4 of the fourth sub-array SA4 in this stated order. The first arrangement structure CG1 and the second arrangement structure CG2 may respectively refer to the same contact arrangement types as the first arrangement structure CG1 and the second arrangement structure CG2 described with reference to FIG. 3.

FIG. 12 is a diagram illustrating parasitic capacitance of channel structures connected to each bit line of a memory device according to inventive concepts.

Referring to FIGS. 10 and 12, as the contacts CNT having the first arrangement structure CG1, the contacts CNT having the first arrangement structure CG1, the contacts CNT having the second arrangement structure CG2, and the contacts CNT having the second arrangement structure CG2 are respectively arranged in the first to fourth channel groups CA1 to CA4 in this stated order, a contact arrangement structure of the third sub-array SA3 may be referred to as CG1-CG1-CG2-CG2.

The third-type channel structure CS3 of the first channel group CA1, the third-type channel structure CS3 of the second channel group CA2, the second-type channel structure CS2 of the third channel group CA3, and the second-type channel structure CS2 of the fourth channel group CA4 may be connected to the first bit line BL1. Accordingly, the sum of the parasitic capacitances of the channel structures CS of the third sub-array SA3, which are connected to the first bit line BL1, may be or may be proportional to "3+3+2+2=10".

The first-type channel structure CS1 of the first channel group CA1, the second-type channel structure CS2 of the second channel group CA2, the third-type channel structure CS3 of the third channel group CA3, and the third-type channel structure CS3 of the fourth channel group CA4 may be connected to the second bit line BL2. Accordingly, the sum of the parasitic capacitances of the channel structures CS of the third sub-array SA3, which are connected to the second bit line BL2, may be or may be proportional to "1+2+3+3=9".

The second-type channel structure CS2 of the first channel group CA1, the second-type channel structure CS2 of the second channel group CA2, the third-type channel structure CS3 of the third channel group CA3, and the third-type channel structure CS3 of the fourth channel group CA4 may be connected to the third bit line BL3. Accordingly, the sum of the parasitic capacitances of the channel structures CS of the third sub-array SA3, which are connected to the third bit line BL3, may be or may be proportional to "2+2+3+3=10".

The third-type channel structure CS3 of the first channel group CA1, the third-type channel structure CS3 of the second channel group CA2, the second-type channel structure CS2 of the third channel group CA3, and the first-type channel structure CS1 of the fourth channel group CA4 may be connected to the fourth bit line BL4. Accordingly, the sum of the parasitic capacitances of the channel structures CS of the third sub-array SA3, which are connected to the fourth bit line BL4, may be or may be proportional to "3+3+2+1=9".

Referring to FIGS. 11 and 12, as the contacts CNT having the second arrangement structure CG2, the contacts CNT having the second arrangement structure CG2, the contacts CNT having the first arrangement structure CG1, and the contacts CNT having the first arrangement structure CG1 are respectively arranged in the first to fourth channel groups CA1 to CA4 in this stated order, a contact arrangement structure of the fourth sub-array SA4 may be referred to as CG2-CG2-CG1-CG1.

The first-type channel structure CS1 of the first channel group CA1, the second-type channel structure CS2 of the second channel group CA2, the third-type channel structure CS3 of the third channel group CA3, and the third-type channel structure CS3 of the fourth channel group CA4 may be connected to the first bit line BL1. Accordingly, the sum of the parasitic capacitances of the channel structures CS of the fourth sub-array SA4, which are connected to the first bit line BL1, may be or may be proportional to "1+2+3+3=9".

The third-type channel structure CS3 of the first channel group CA1, the third-type channel structure CS3 of the second channel group CA2, the second-type channel structure CS2 of the third channel group CA3, and the second-type channel structure CS2 of the fourth channel group CA4 may be connected to the second bit line BL2. Accordingly, the sum of the parasitic capacitances of the channel structures CS of the fourth sub-array SA4, which are connected to the second bit line BL2, may be or may be proportional to "3+3+2+2=10".

The third-type channel structure CS3 of the first channel group CA1, the third-type channel structure CS3 of the second channel group CA2, the second-type channel structure CS2 of the third channel group CA3, and the first-type channel structure CS1 of the fourth channel group CA4 may be connected to the third bit line BL3. Accordingly, the sum of the parasitic capacitances of the channel structures CS of the fourth sub-array SA4, which are connected to the third bit line BL3, may be or may be proportional to "3+3+2+1=9".

The second-type channel structure CS2 of the first channel group CA1, the second-type channel structure CS2 of the second channel group CA2, the third-type channel structure CS3 of the third channel group CA3, and the third-type channel structure CS3 of the fourth channel group CA4 may be connected to the fourth bit line BL4. Accordingly, the sum of the parasitic capacitances of the channel structures CS of the fourth sub-array SA4, which are connected to the fourth bit line BL4, may be or may be proportional to "2+2+3+3=10".

The memory cell array (for example, 100a of FIG. 9) of the memory device according to inventive concepts includes sub-arrays (for example, the third sub-array SA3 and the fourth sub-array SA4), which are different from each other in an arrangement structure of contacts that connect channel structures to bit lines corresponding to the channel structures, whereby electrical characteristics of the respective bit lines due to parasitic capacitances of the channel structures may be uniform therebetween.

Figure 13:
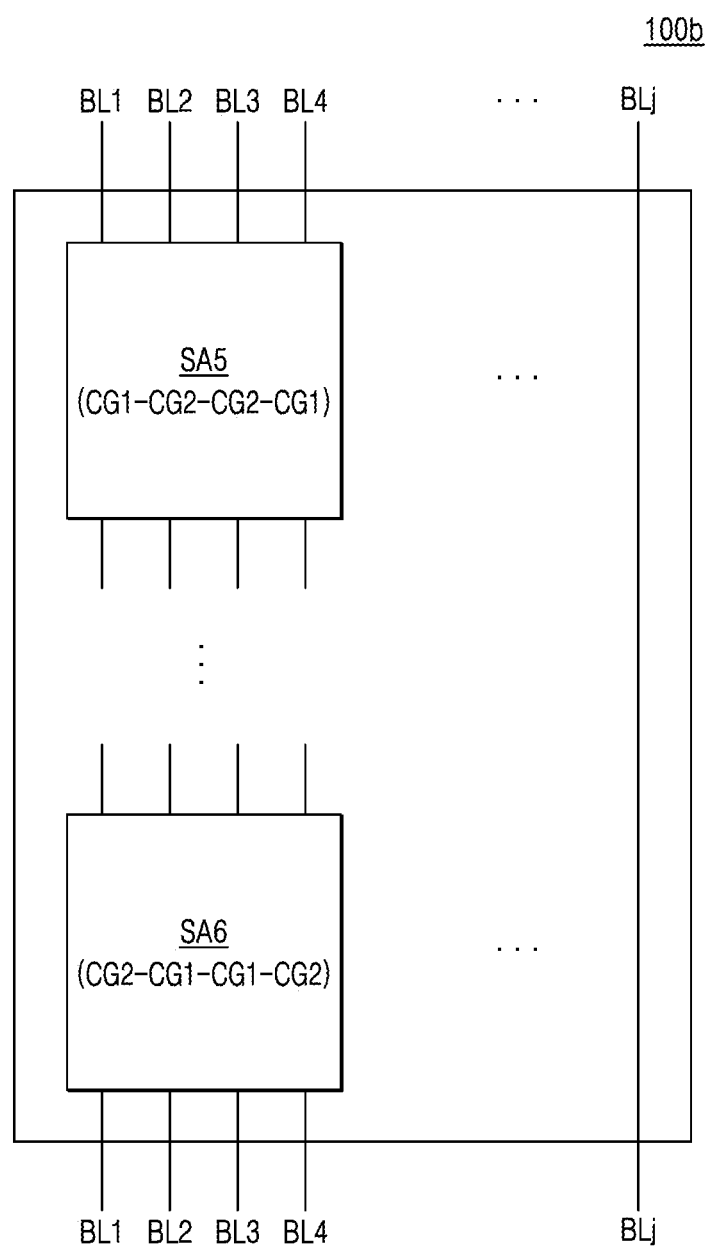
FIG. 13 is a diagram illustrating a memory cell array of a memory device, according to some example embodiments of inventive concepts.

FIG. 13 is a diagram illustrating a memory cell array of a memory device, according to some example embodiments of inventive concepts. In descriptions regarding FIG. 13, repeated descriptions given with reference to FIG. 4 will be omitted.

Referring to FIG. 13, a memory cell array 100b may include a fifth sub-array SA5 and a sixth sub-array SA6, which are defined by a plurality of word line cuts and connected to the first to fourth bit lines BL1 to BL4.

In some example embodiments, the fifth sub-array SA5 and the sixth sub-array SA6 may be different from each other in an arrangement structure of contacts that connect channel structures to the first to fourth bit lines BL1 to BL4. Differences in electrical characteristics between the first to fourth bit lines BL1 to BL4 due to differences in parasitic capacitance between the channel structures included in the fifth sub-array SA5 may be canceled out or substantially canceled out by using differences in parasitic capacitance between the channel structures included in the sixth sub-array SA6.

Figure 14:
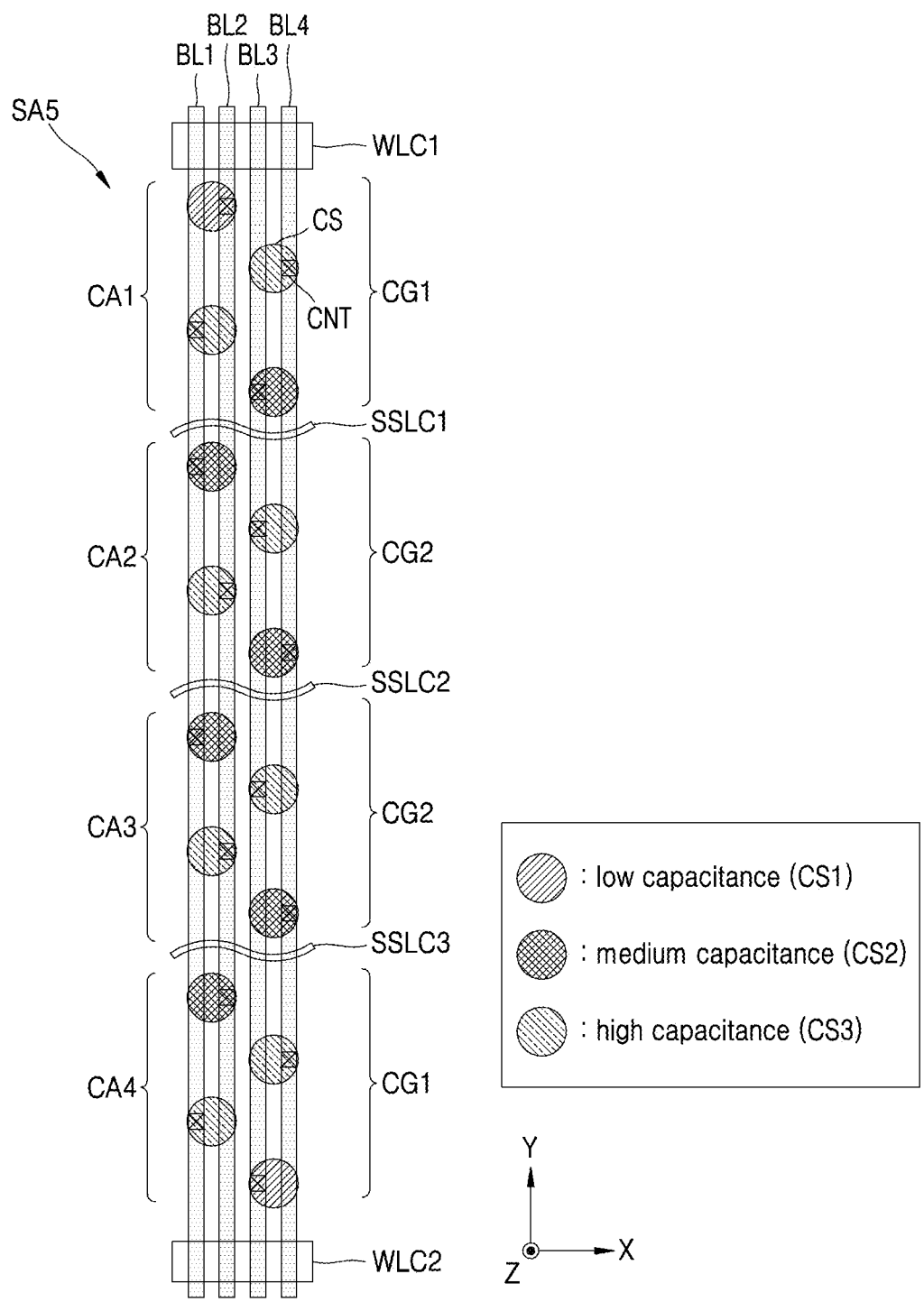
FIGS. 14 and 15 are each a plan view illustrating a memory device according to inventive concepts.
Figure 15:
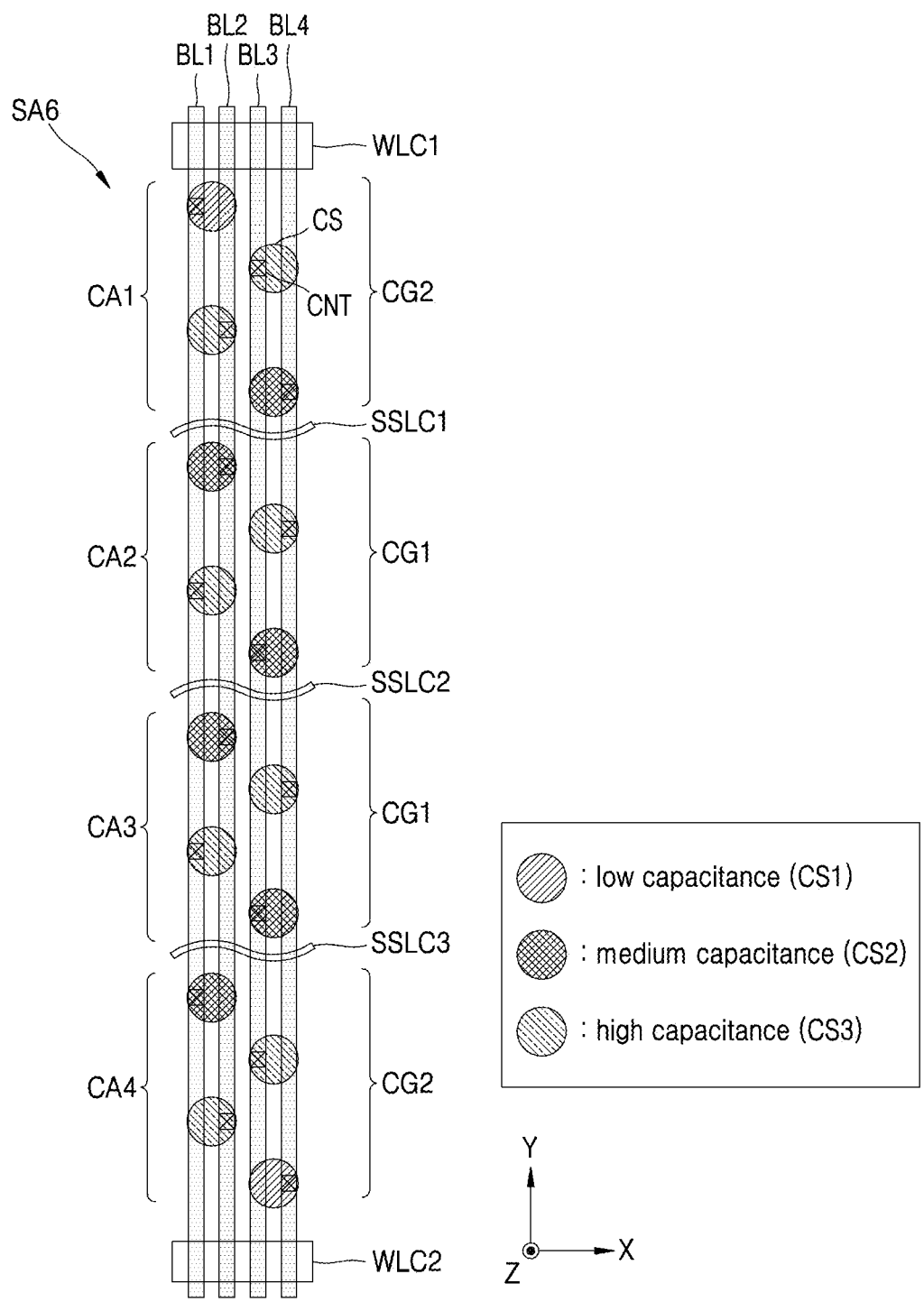

FIGS. 14 and 15 are each a plan view illustrating a memory device according to inventive concepts and are respectively for explaining the fifth sub-array and the sixth sub-array of FIG. 13. In descriptions regarding FIGS. 14 and 15, repeated descriptions given with reference to FIGS. 5 and 7 will be omitted.

Referring to FIG. 14, the contacts CNT having the first arrangement structure CG1, the contacts CNT having the second arrangement structure CG2, the contacts CNT having the second arrangement structure CG2, and the contacts CNT having the first arrangement structure CG1 may be respectively arranged in the first to fourth channel groups CA1 to CA4 of the fifth sub-array SA5 in this stated order.

Referring to FIG. 15, the contacts CNT having the second arrangement structure CG2, the contacts CNT having the first arrangement structure CG1, the contacts CNT having the first arrangement structure CG1, and the contacts CNT having the second arrangement structure CG2 may be respectively arranged in the first to fourth channel groups CA1 to CA4 of the sixth sub-array SA6 in this stated order.

FIG. 16 is a diagram illustrating parasitic capacitances of channel structures connected to each bit line of a memory device according to inventive concepts.

Referring to FIGS. 14 and 16, as the contacts CNT having the first arrangement structure CG1, the contacts CNT having the second arrangement structure CG2, the contacts CNT having the second arrangement structure CG2, and the contacts CNT having the first arrangement structure CG1 are respectively arranged in the first to fourth channel groups CA1 to CA4 in this stated order, a contact arrangement structure of the fifth sub-array SA5 may be referred to as CG1-CG2-CG2-CG1.

The third-type channel structure CS3 of the first channel group CA1, the second-type channel structure CS2 of the second channel group CA2, the second-type channel structure CS2 of the third channel group CA3, and the third-type channel structure CS3 of the fourth channel group CA4 may be connected to the first bit line BL1. Accordingly, the sum of the parasitic capacitances of the channel structures CS of the fifth sub-array SA5, which are connected to the first bit line BL1, may be or may be proportional to "3+2+2+3=10".

The first-type channel structure CS1 of the first channel group CA1, the third-type channel structure CS3 of the second channel group CA2, the third-type channel structure CS3 of the third channel group CA3, and the second-type channel structure CS2 of the fourth channel group CA4 may be connected to the second bit line BL2. Accordingly, the sum of the parasitic capacitances of the channel structures CS of the fifth sub-array SA5, which are connected to the second bit line BL2, may be or may be proportional to "1+3+3+2=9".

The second-type channel structure CS2 of the first channel group CA1, the third-type channel structure CS3 of the second channel group CA2, the third-type channel structure CS3 of the third channel group CA3, and the first-type channel structure CS1 of the fourth channel group CA4 may be connected to the third bit line BL3. Accordingly, the sum of the parasitic capacitances of the channel structures CS of the fifth sub-array SA5, which are connected to the third bit line BL3, may be or may be proportional to "2+3+3+1=9".

The third-type channel structure CS3 of the first channel group CA1, the second-type channel structure CS2 of the second channel group CA2, the second-type channel structure CS2 of the third channel group CA3, and the third-type channel structure CS3 of the fourth channel group CA4 may be connected to the fourth bit line BL4. Accordingly, the sum of the parasitic capacitances of the channel structures CS of the fifth sub-array SA5, which are connected to the fourth bit line BL4, may be or may be proportional to "3+2+2+3=10".

Referring to FIGS. 15 and 16, as the contacts CNT having the second arrangement structure CG2, the contacts CNT having the first arrangement structure CG1, the contacts CNT having the first arrangement structure CG1, and the contacts CNT having the second arrangement structure CG2 are respectively arranged in the first to fourth channel groups CA1 to CA4 in this stated order, a contact arrangement structure of the sixth sub-array SA6 may be referred to as CG2-CG1-CG1-CG2.

The first-type channel structure CS1 of the first channel group CA1, the third-type channel structure CS3 of the second channel group CA2, the third-type channel structure CS3 of the third channel group CA3, and the second-type channel structure CS2 of the fourth channel group CA4 may be connected to the first bit line BL1. Accordingly, the sum of the parasitic capacitances of the channel structures CS of the sixth sub-array SA6, which are connected to the first bit line BL1, may be or may be proportional to "1+3+3+2=9".

The third-type channel structure CS3 of the first channel group CA1, the second-type channel structure CS2 of the second channel group CA2, the second-type channel structure CS2 of the third channel group CA3, and the third-type channel structure CS3 of the fourth channel group CA4 may be connected to the second bit line BL2. Accordingly, the sum of the parasitic capacitances of the channel structures CS of the sixth sub-array SA6, which are connected to the second bit line BL2, may be or may be proportional to "3+2+2+3=10".

The third-type channel structure CS3 of the first channel group CA1, the second-type channel structure CS2 of the second channel group CA2, the second-type channel structure CS2 of the third channel group CA3, and the third-type channel structure CS3 of the fourth channel group CA4 may be connected to the third bit line BL3. Accordingly, the sum of the parasitic capacitances of the channel structures CS of the sixth sub-array SA6, which are connected to the third bit line BL3, may be or may be proportional to "3+2+2+3=10".

The second-type channel structure CS2 of the first channel group CA1, the third-type channel structure CS3 of the second channel group CA2, the third-type channel structure CS3 of the third channel group CA3, and the first-type channel structure CS1 of the fourth channel group CA4 may be connected to the fourth bit line BL4. Accordingly, the sum of the parasitic capacitances of the channel structures CS of the sixth sub-array SA6, which are connected to the fourth bit line BL4, may be or may be proportional to "2+3+3+1=9".

The memory cell array (for example, 100b of FIG. 13) of the memory device according to inventive concepts includes sub-arrays (for example, the fifth sub-array SA5 and the sixth sub-array SA6), which are different from each other in an arrangement structure of contacts that connect channel structures to bit lines corresponding to the channel structures, whereby electrical characteristics of the bit lines due to parasitic capacitances of the channel structures may be uniform therebetween.

Figure 17:
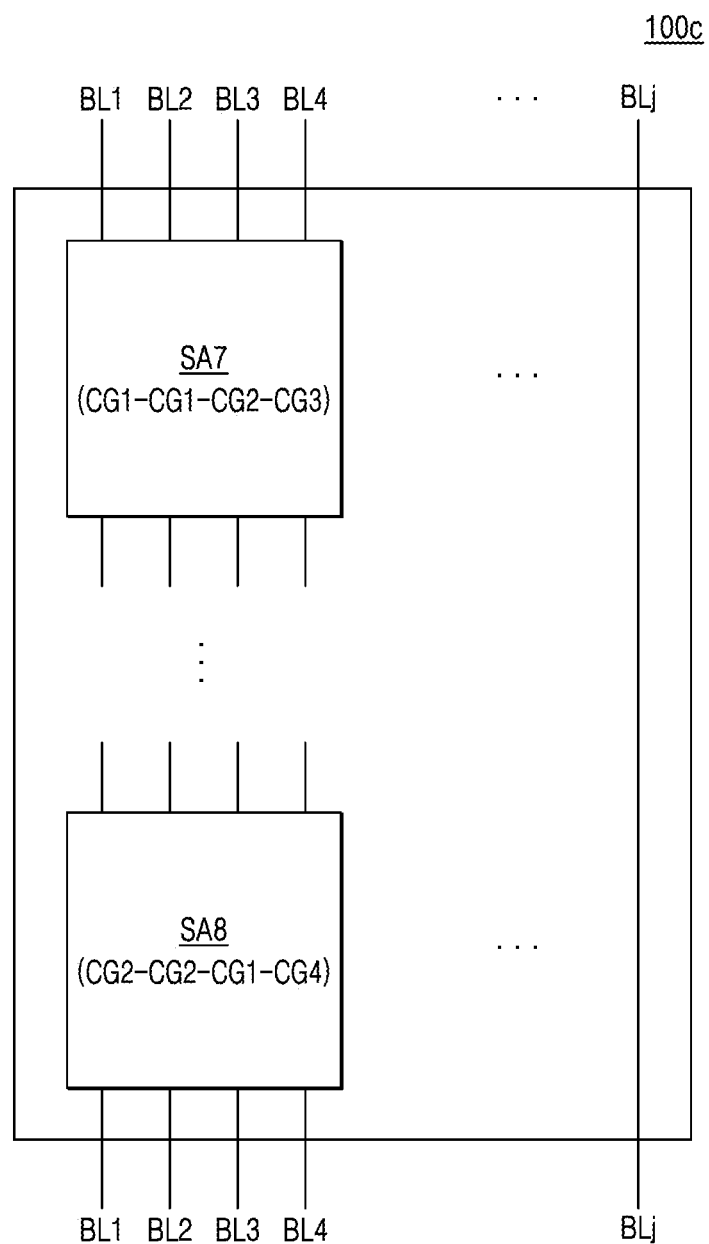
FIG. 17 is a diagram illustrating a memory cell array of a memory device, according to some example embodiments of inventive concepts.

FIG. 17 is a diagram illustrating a memory cell array of a memory device, according to some example embodiments of inventive concepts. In descriptions regarding FIG. 17, repeated descriptions given with reference to FIG. 4 will be omitted.

Referring to FIG. 17, a memory cell array 100c may include a seventh sub-array SA7 and an eighth sub-array SA8, which are defined by a plurality of word line cuts and connected to the first to fourth bit lines BL1 to BL4.

The contacts having the first arrangement structure CG1, the second arrangement structure CG2, and the third arrangement structure CG3 of FIG. 3 may be formed in the seventh sub-array SA7, and the contacts having the first arrangement structure CG1, the second arrangement structure CG2, and the fourth arrangement structure CG4 may be formed in the eighth sub-array SA8. In some example embodiments, the seventh sub-array SA7 and the eighth sub-array SA8 may be different from each other in an arrangement structure of contacts that connect channel structures to the first to fourth bit lines BL1 to BL4. Differences in electrical characteristics between the first to fourth bit lines BL1 to BL4 due to differences in parasitic capacitance between the channel structures included in the seventh sub-array SA7 may be canceled out or substantially canceled out by using differences in parasitic capacitance between the channel structures included in the eighth sub-array SA8.

Figure 18:
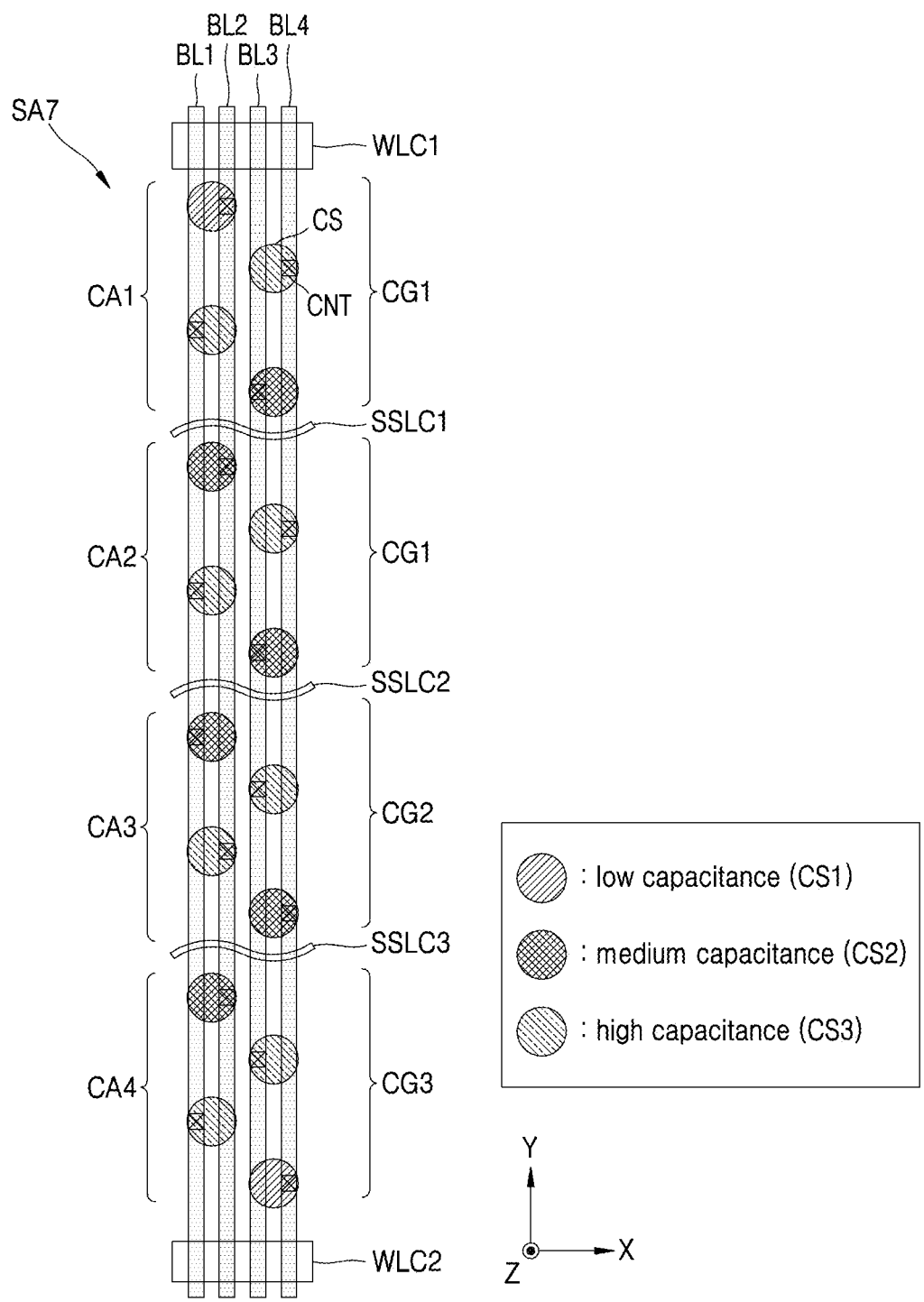
FIGS. 18 and 19 are each a plan view illustrating a memory device according to inventive concepts.
Figure 19:
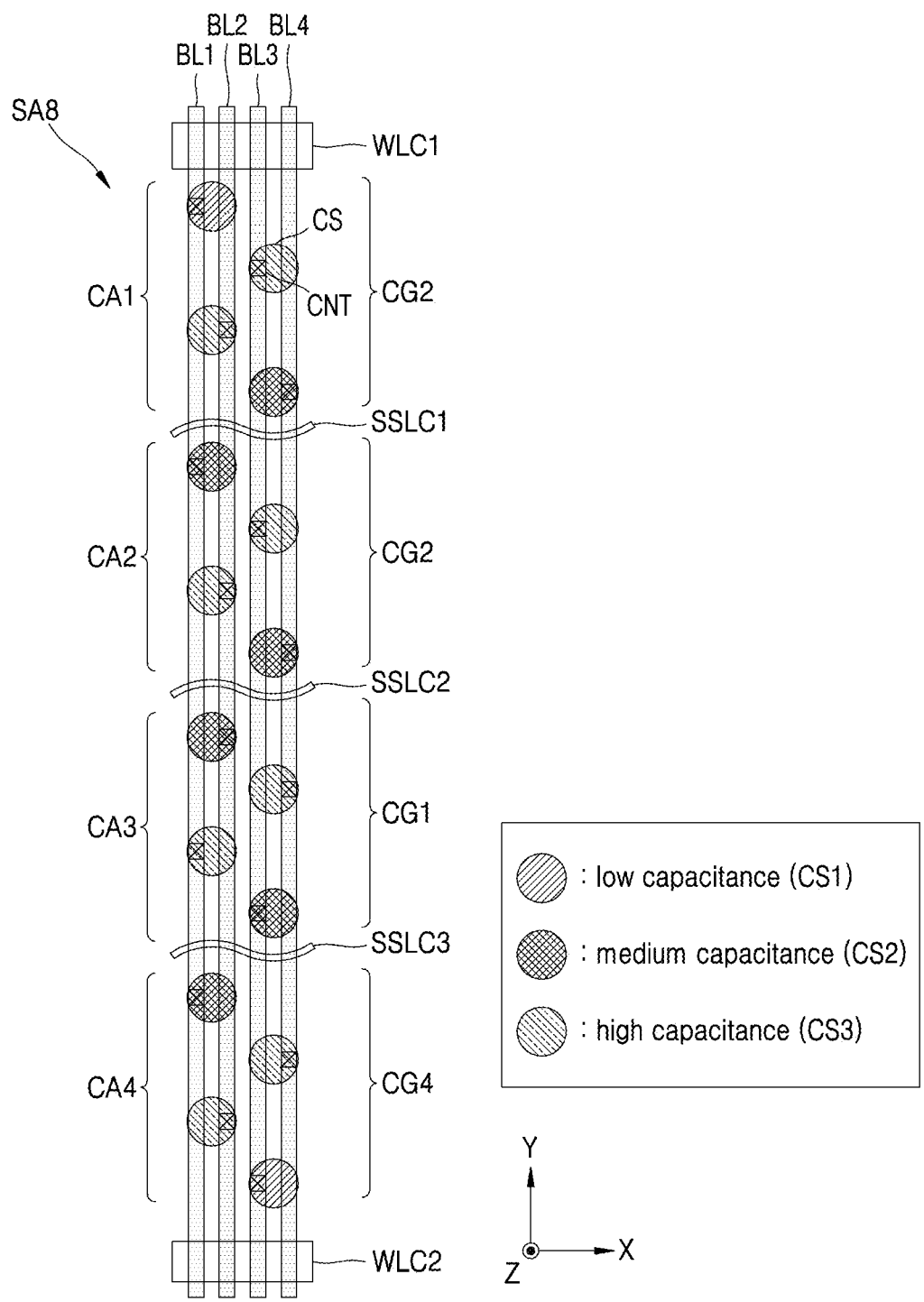

FIGS. 18 and 19 are each a plan view illustrating a memory device according to inventive concepts and are respectively for explaining the seventh sub-array and the eighth sub-array of FIG. 17. In descriptions regarding FIGS. 18 and 19, repeated descriptions given with reference to FIGS. 5 and 7 will be omitted.

Referring to FIG. 18, the contacts CNT having the first arrangement structure CG1, the contacts CNT having the first arrangement structure CG1, the contacts CNT having the second arrangement structure CG2, and the contacts CNT having the third arrangement structure CG3 may be respectively arranged in the first to fourth channel groups CA1 to CA4 of the seventh sub-array SA7 in this stated order.

Referring to FIG. 19, the contacts CNT having the second arrangement structure CG2, the contacts CNT having the second arrangement structure CG2, the contacts CNT having the first arrangement structure CG1, and the contacts CNT having the fourth arrangement structure CG4 may be respectively arranged in the first to fourth channel groups CA1 to CA4 of the eighth sub-array SA8 in this stated order.

FIG. 20 is a diagram illustrating parasitic capacitances of channel structures connected to each bit line of a memory device according to inventive concepts.

Referring to FIGS. 18 and 20, as the contacts CNT having the first arrangement structure CG1, the contacts CNT having the first arrangement structure CG1, the contacts CNT having the second arrangement structure CG2, and the contacts CNT having the third arrangement structure CG3 are respectively arranged in the first to fourth channel groups CA1 to CA4 in this stated order, a contact arrangement structure of the seventh sub-array SA7 may be referred to as CG1-CG1-CG2-CG3.

The third-type channel structure CS3 of the first channel group CA1, the third-type channel structure CS3 of the second channel group CA2, the second-type channel structure CS2 of the third channel group CA3, and the third-type channel structure CS3 of the fourth channel group CA4 may be connected to the first bit line BL1. Accordingly, the sum of the parasitic capacitances of the channel structures CS of the seventh sub-array SA7, which are connected to the first bit line BL1, may be or may be proportional to "3+3+2+3=11".

The first-type channel structure CS1 of the first channel group CA1, the second-type channel structure CS2 of the second channel group CA2, the third-type channel structure CS3 of the third channel group CA3, and the second-type channel structure CS2 of the fourth channel group CA4 may be connected to the second bit line BL2. Accordingly, the sum of the parasitic capacitances of the channel structures CS of the seventh sub-array SA7, which are connected to the second bit line BL2, may be or may be proportional to "1+2+3+2=8".

The second-type channel structure CS2 of the first channel group CA1, the second-type channel structure CS2 of the second channel group CA2, the third-type channel structure CS3 of the third channel group CA3, and the third-type channel structure CS3 of the fourth channel group CA4 may be connected to the third bit line BL3. Accordingly, the sum of the parasitic capacitances of the channel structures CS of the seventh sub-array SA7, which are connected to the third bit line BL3, may be or may be proportional to "2+2+3+3=10".

The third-type channel structure CS3 of the first channel group CA1, the third-type channel structure CS3 of the second channel group CA2, the second-type channel structure CS2 of the third channel group CA3, and the first-type channel structure CS1 of the fourth channel group CA4 may be connected to the fourth bit line BL4. Accordingly, the sum of the parasitic capacitances of the channel structures CS of the seventh sub-array SA7, which are connected to the fourth bit line BL4, may be or may be proportional to "3+3+2+1=9".

Referring to FIGS. 19 and 20, as the contacts CNT having the second arrangement structure CG2, the contacts CNT having the second arrangement structure CG2, the contacts CNT having the first arrangement structure CG1, and the contacts CNT having the fourth arrangement structure CG4 are respectively arranged in the first to fourth channel groups CA1 to CA4 in this stated order, a contact arrangement structure of the eighth sub-array SA8 may be referred to as CG2-CG2-CG1-CG4.

The first-type channel structure CS1 of the first channel group CA1, the second-type channel structure CS2 of the second channel group CA2, the third-type channel structure CS3 of the third channel group CA3, and the second-type channel structure CS2 of the fourth channel group CA4 may be connected to the first bit line BL1. Accordingly, the sum of the parasitic capacitances of the channel structures CS of the eighth sub-array SA8, which are connected to the first bit line BL1, may be or may be proportional to "1+2+3+2=8".

The third-type channel structure CS3 of the first channel group CA1, the third-type channel structure CS3 of the second channel group CA2, the second-type channel structure CS2 of the third channel group CA3, and the third-type channel structure CS3 of the fourth channel group CA4 may be connected to the second bit line BL2. Accordingly, the sum of the parasitic capacitances of the channel structures CS of the eighth sub-array SA8, which are connected to the second bit line BL2, may be or may be proportional to "3+3+2+3=11".

The third-type channel structure CS3 of the first channel group CA1, the third-type channel structure CS3 of the second channel group CA2, the second-type channel structure CS2 of the third channel group CA3, and the first-type channel structure CS1 of the fourth channel group CA4 may be connected to the third bit line BL3. Accordingly, the sum of the parasitic capacitances of the channel structures CS of the eighth sub-array SA8, which are connected to the third bit line BL3, may be or may be proportional to "3+3+2+1=9".

The second-type channel structure CS2 of the first channel group CA1, the second-type channel structure CS2 of the second channel group CA2, the third-type channel structure CS3 of the third channel group CA3, and the third-type channel structure CS3 of the fourth channel group CA4 may be connected to the fourth bit line BL4. Accordingly, the sum of the parasitic capacitances of the channel structures CS of the eighth sub-array SA8, which are connected to the fourth bit line BL4, may be or may be proportional to "2+2+3+3=10".

The memory cell array (for example, 100c of FIG. 17) of the memory device according to inventive concepts includes sub-arrays (for example, the seventh sub-array SA7 and the eighth sub-array SA8), which are different from each other in an arrangement structure of contacts that connect channel structures to bit lines corresponding to the channel structures, whereby electrical characteristics of the respective bit lines due to parasitic capacitances of the channel structures may be uniform therebetween.

Figure 21:
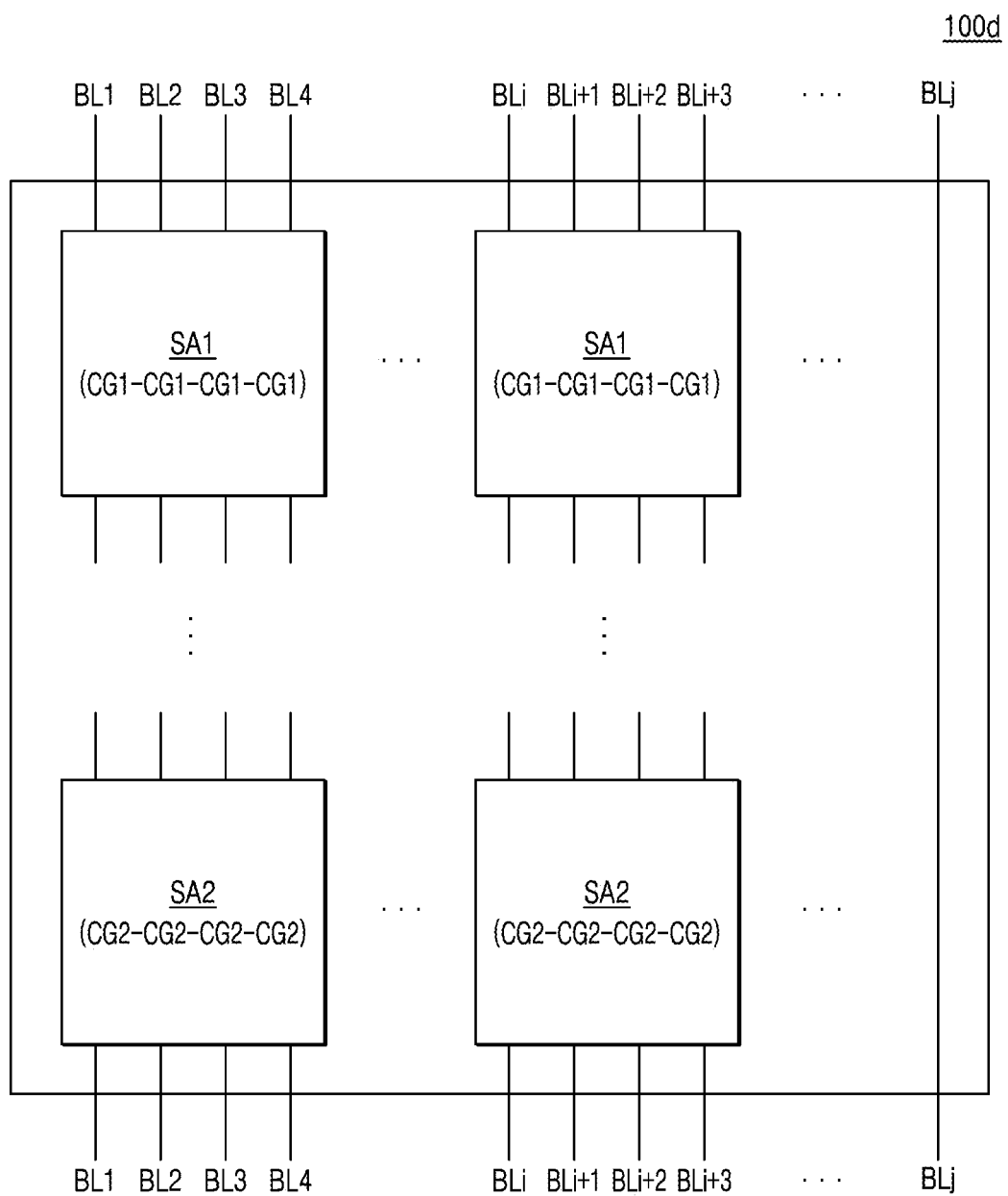
FIGS. 21 and 22 are each a diagram illustrating a memory cell array of a memory device, according to some example embodiments of inventive concepts.
Figure 22:
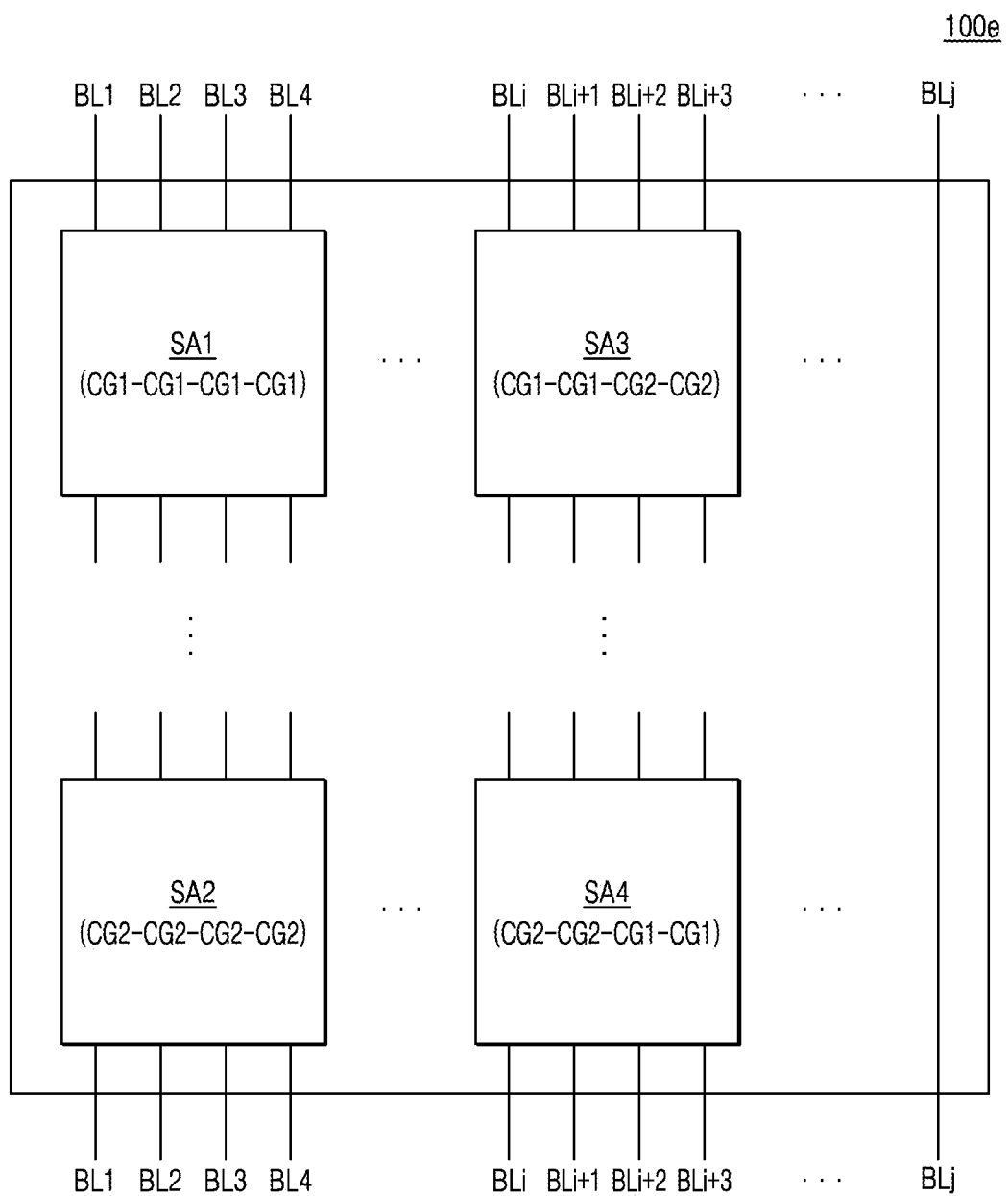

FIGS. 21 and 22 are each a diagram illustrating a memory cell array of a memory device, according to some example embodiments of inventive concepts.

Referring to FIG. 21, in a memory cell array 100d, sub-arrays having the same contact arrangement structure may be arranged in alignment with each other in a direction (for example, the X-axis direction) perpendicular to an extension direction of a plurality of bit lines BL1 to BLj.

The memory cell array 100d may include the first sub-array SA1 and the second sub-array SA2, which are connected to the first to fourth bit lines BL1 to BL4, and may include a first sub-array SA1d and a second sub-array SA2d, which are connected to $i^{-th}$ to $i+3^{-th}$ bit lines BLi to BLi+3. The first sub-array SA1 and the first sub-array SA1d may each have the same structure as the first sub-array SA1 of FIG. 5, and the second sub-array SA2 and the second sub-array SA2d may each have the same structure as the second sub-array SA2 of FIG. 7.

The first sub-array SA1 and the first sub-array SA1d may be arranged in alignment with each other in the X-axis direction, and the second sub-array SA2 and the second sub-array SA2d may be arranged in alignment with each other in the X-axis direction. However, this is merely an example for convenience of description, and the memory cell array 100d according to inventive concepts is not limited to the example shown in FIG. 21.

Word line cuts arranged at boundaries of the first sub-array SA1 and defining the first sub-array SA1 may extend in the X-axis direction and may also define the first sub-array SA1d. The first sub-array SA1 and the first sub-array SA1d may be arranged adjacent to each other (i=5), or another sub-array may be arranged between the first sub-array SA1 and the first sub-array SA1d.

Word line cuts arranged at boundaries of the second sub-array SA2 and defining the second sub-array SA2 may extend in the X-axis direction and may also define the second sub-array SA2d. Here, the second sub-array SA2 and the second sub-array SA2d may be arranged adjacent to each other (i=5), or another sub-array may be arranged between the second sub-array SA2 and the second sub-array SA2d. However, the example shown in FIG. 21 is merely an example for convenience of description, and the memory cell array 100d according to inventive concepts is not limited to the example shown in FIG. 21. The memory cell array 100d may include sub-arrays having various contact arrangement structures, and sub-arrays having the same contact arrangement structure may be arranged in alignment with each other in the X-axis direction.

Referring to FIG. 22, in a memory cell array 100e, sub-arrays having different contact arrangement structures may be arranged in alignment with each other in the X-axis direction.

The memory cell array 100e may include the first sub-array SA1 and the second sub-array SA2, which are connected to the first to fourth bit lines BL1 to BL4, and may include a third sub-array SA3e and a fourth sub-array SA4e, which are connected to the $i^{-th}$ to $i+3^{-th}$ bit lines BLi to BLi+3. The third sub-array SA3e may have the same structure as the third sub-array SA3 of FIG. 10, and the fourth sub-array SA4e may have the same structure as the fourth sub-array SA4 of FIG. 11.

For example, the first sub-array SA1 and the third sub-array SA3e may be arranged in alignment with each other in the X-axis direction, and the second sub-array SA2 and the fourth sub-array SA4e may be arranged in alignment with each other in the X-axis direction. However, the example shown in FIG. 22 is merely an example for convenience of description, and the memory cell array 100e according to inventive concepts is not limited to the example shown in FIG. 22. The memory cell array 100e may include sub-arrays having various contact arrangement structures, and sub-arrays having different contact arrangement structures may be arranged in alignment with each other in the X-axis direction.

Figure 23:
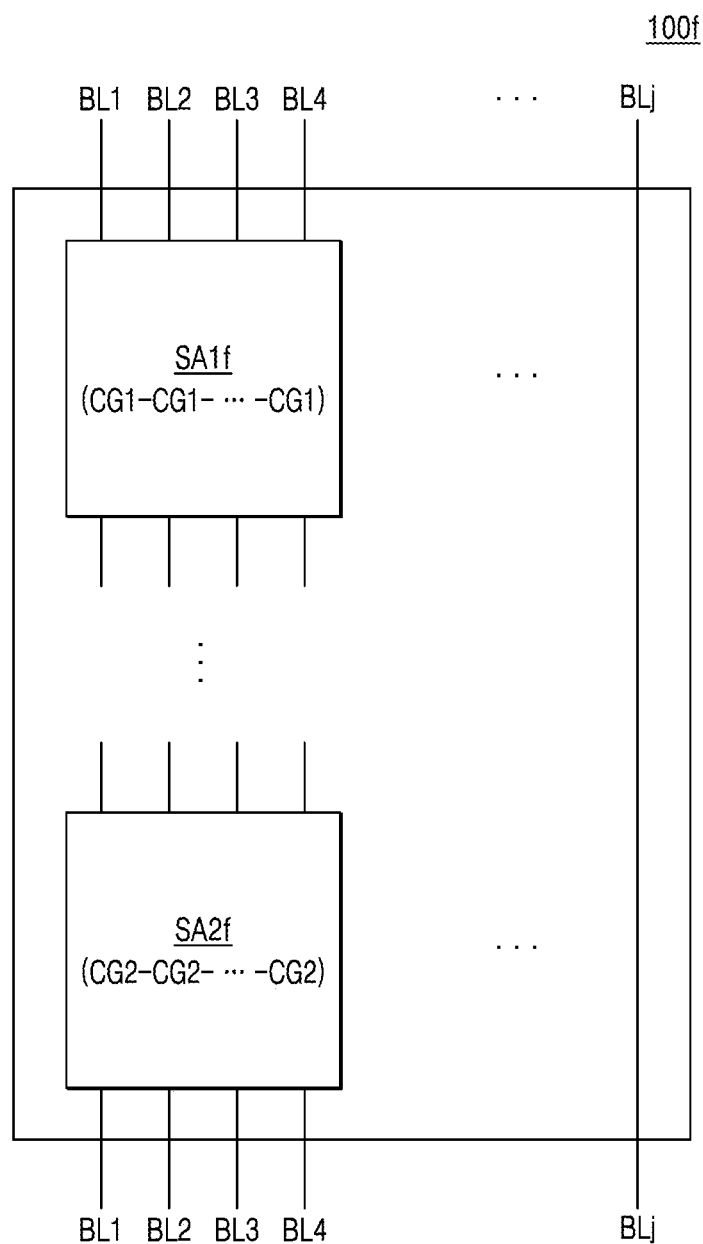
FIG. 23 is a diagram illustrating a memory cell array of a memory device, according to some example embodiments of inventive concepts.
Figure 25:
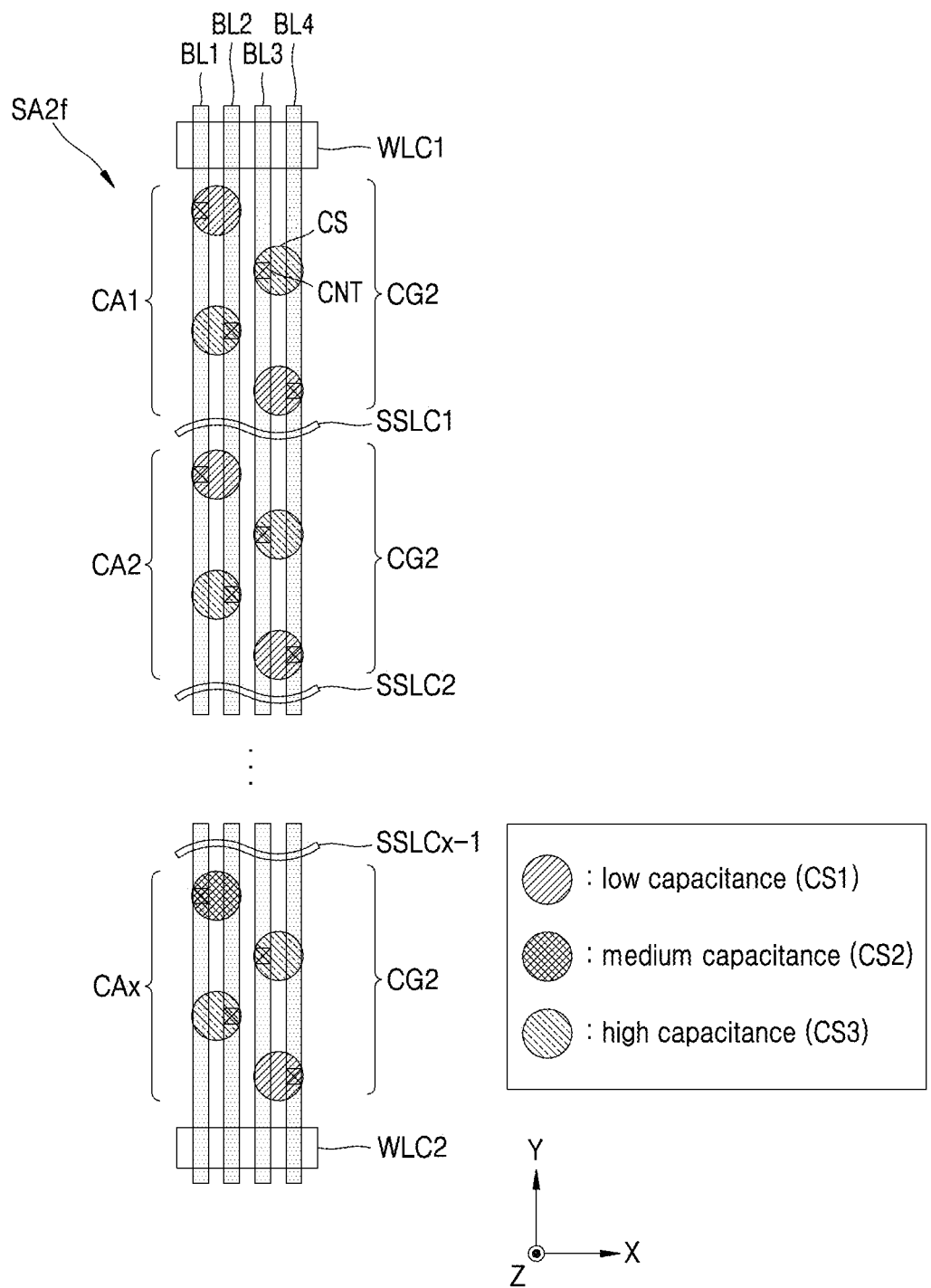

FIG. 23 is a diagram illustrating a memory cell array of a memory device, according to some example embodiments of inventive concepts. FIGS. 24 and 25 are each a plan view illustrating a memory device according to inventive concepts and are respectively for explaining a first sub-array and a second sub-array of FIG. 23. In descriptions regarding FIG. 23, repeated descriptions given with reference to FIG. 4 will be omitted, and in descriptions regarding FIGS. 24 and 25, repeated descriptions given with reference to FIGS. 5 and 7 will be omitted.

Referring to FIG. 23, a memory cell array 100f may include a first sub-array SA1f and a second sub-array SA2f. The first sub-array SA1f and the second sub-array SA2f may be different from each other in an arrangement structure of contacts that connect channel structures to the first to fourth bit lines BL1 to BL4. In some example embodiments, contact patterns having a particular arrangement structure may be repeatedly formed in each of the first sub-array SA1f and the second sub-array SA2f.

Referring to FIG. 24, the first sub-array SA1f may include the plurality of channel structures CS arranged in a honeycomb structure and may include first to $x^{-th}$ channel groups CA1 to CAx separated by first to $x-1^{-th}$ select line cut regions SSLC1 to SSLCx−1. Here, x may be a natural number greater than 4 and may have a value that is variously changed.

An arrangement structure of the plurality of channel structures CS included in the first channel group CA1 may be consistent with that obtained by shifting the plurality of channel structures CS included in the second channel group CA2 in the Y-axis direction. In addition, the arrangement structure of the plurality of channel structures CS included in the second channel group CA2 may be consistent with that obtained by shifting the plurality of channel structures CS included in the $x^{-th}$ channel group CAx in the Y-axis direction.

In some example embodiments, the contacts CNT having the first arrangement structure CG1 may be repeatedly arranged in each of the first to $x^{-th}$ channel groups CA1 to CAx of the first sub-array SA1f.

Referring to FIG. 25, the second sub-array SA2f may include the plurality of channel structures CS arranged in a honeycomb structure/hexagonal structure/regular hexagonal structure and may include the first to $x^{-th}$ channel groups CA1 to CAx separated by the first to $x-1^{-th}$ select line cut regions SSLC1 to SSLCx−1. Here, x may be a natural number greater than 4.

In some example embodiments, the contacts CNT having the second arrangement structure CG2 may be repeatedly arranged in each of the first to $x^{-th}$ channel groups CA1 to CAx of the second sub-array SA2f.

However, the memory cell array (for example, 100f of FIG. 23) according to inventive concepts is not limited to including the first sub-array SA1f, which includes only the contacts having the first arrangement structure CG1, and the second sub-array SA2f, which includes only the contacts having the second arrangement structure CG2. The memory cell array 100f according to inventive concepts may include a particular sub-array, which includes contacts having at least one arrangement structure selected from the first to fourth arrangement structures CG1 to CG4 of FIG. 3, and may include another sub-array for canceling out or substantially canceling out differences in parasitic capacitance between channel structures included in the particular sub-array.

Figure 26:
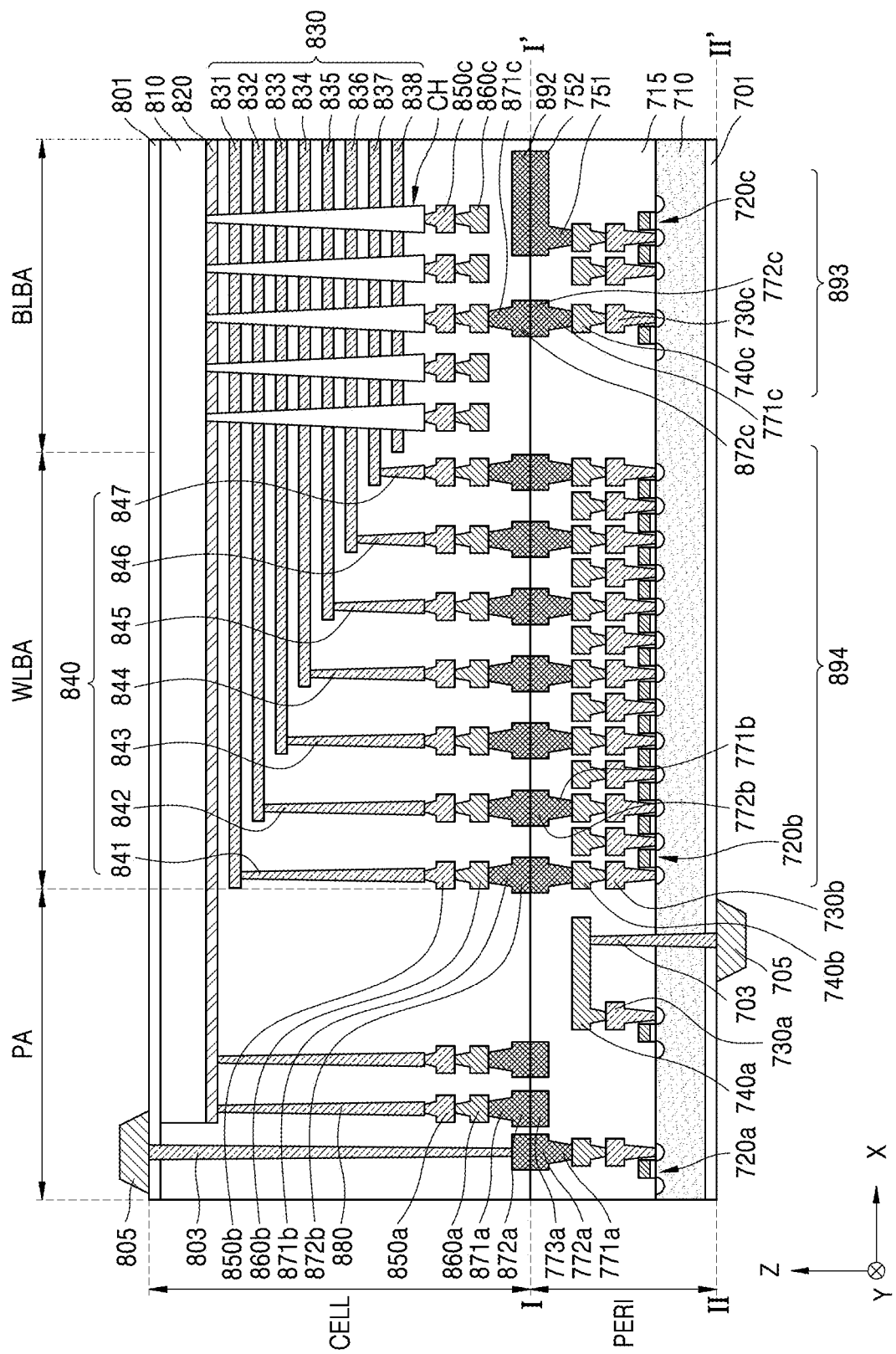
FIG. 26 is a block diagram illustrating a memory device having a chip-to-chip structure, according to exemplary embodiment of inventive concepts.

FIG. 26 is a block diagram illustrating a memory device having a chip-to-chip structure, according to exemplary embodiment of inventive concepts.

FIG. 26 illustrates a memory device 900 having a chip-to-chip structure, according to exemplary embodiments of inventive concepts.

Referring to FIG. 26, a memory device 900 may have/include a chip-to-chip (C2C) structure. The C2C structure may refer to a structure formed by manufacturing an upper chip including a memory cell region CELL on a first wafer, manufacturing a lower chip including a peripheral circuit region PERI on a second wafer, different from the first wafer, and connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten. Each memory device of the above embodiments may be implemented as the memory device 900.

Each of the peripheral circuit region PERI and the memory cell region CELL of the memory device 900 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In some example embodiments, the first metal layers 730a, 730b, and 730c may be formed of tungsten having relatively high resistance, and the second metal layers 740a, 740b, and 740c may be formed of copper having relatively low resistance.

In some example embodiments illustrate in FIG. 26, although the first metal layers 730a, 730b, and 730c and the second metal layers 740a, 740b, and 740c are shown and described, they are not limited thereto, and one or more metal layers may be further formed on the second metal layers 740a, 740b, and 740c. At least a portion of the one or more metal layers formed on the second metal layers 740a, 740b, and 740c may be formed of aluminum or the like having a lower resistance than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically connected to upper bonding metals 871b and 872b in a bonding manner, and the lower bonding metals 771b and 772b and the upper bonding metals 871b and 872b may be formed of aluminum, copper, tungsten, or the like. Further, the upper bonding metals 871b and 872b in the memory cell region CELL may be referred as first metal pads and the lower bonding metals 771b and 772b in the peripheral circuit region PERI may be referred as second metal pads.

The memory cell region CELL may include at least one memory block. The memory cell region CELL may include a second substrate 810 and a common source line 820. On the second substrate 810, a plurality of word lines 831 to 838 (i.e., 830) may be stacked in a vertical direction (a Z axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction that is perpendicular to the upper surface of the second substrate 810, and may pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be or correspond to a bit line contact, and the second metal layer 860c may be or correspond to a plurality bit lines. In some example embodiments, the second metal layer 860c may extend in a second horizontal direction (a Y axis direction), parallel to the upper surface of the second substrate 810.

In some example embodiments illustrated in FIG. 26, an area in which the channel structure CH, the second metal layer 860c, and the like are disposed may be defined as the bit line bonding area BLBA. In the bit line bonding area BLBA, the second metal layer 860c may be electrically connected to the circuit elements 720c providing a page buffer 893 in the peripheral circuit region PERI. For example, the second metal layer 860c may be connected to upper bonding metals 871c and 872c in the memory cell region CELL, and the upper bonding metals 871c and 872c may be connected to lower bonding metals 771c and 772c connected to the circuit elements 720c of the page buffer 893.

In the word line bonding area WLBA, the plurality of word lines 830 may extend in a first horizontal direction (the X axis direction), parallel to the upper surface of the second substrate 810, and may be connected to a plurality of cell contact plugs 841 to 847 (e.g., 840). The plurality of word lines 830 and the plurality of cell contact plugs 840 may be connected to each other in pads provided by at least a portion of the plurality of word lines 830 extending in different lengths in the first horizontal direction. A first metal layer 850b and a second metal layer 860b may be connected to an upper portion of the plurality of cell contact plugs 840 connected to the plurality of word lines 830, sequentially. The plurality of cell contact plugs 840 may be connected to the peripheral circuit region PERI by the upper bonding metals 871b and 872b of the memory cell region CELL and the lower bonding metals 771b and 772b of the peripheral circuit region PERI in the word line bonding area WLBA.

The plurality of cell contact plugs 840 may be electrically connected to the circuit elements 720b providing a row decoder 894 in the peripheral circuit region PERI. In some example embodiments, operating voltages of the circuit elements 720b providing the row decoder 894 may be different than operating voltages of the circuit elements 720c providing the page buffer 893. For example, operating voltages of the circuit elements 720c providing the page buffer 893 may be greater than operating voltages of the circuit elements 720b providing the row decoder 894.

A common source line contact plug 880 may be disposed in the external pad bonding area PA. The common source line contact plug 880 may be formed of a conductive material such as at least one of metal, a metal compound, doped or undoped polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 26, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. Alternatively or additionally, a side insulating film may be disposed between the first input-output contact plug 703 and the first substrate 710 to electrically separate the first input-output contact plug 703 and the first substrate 710.

Referring to FIG. 26, an upper insulating film 801 covering the upper surface of the second substrate 810 may be formed on the second substrate 810, and a second input-output pad 805 may be disposed on the upper insulating film 801. The second input-output pad 805 may be connected to at least one of the plurality of circuit elements 720a, 720b, and 720c disposed in the peripheral circuit region PERI through a second input-output contact plug 803.

According to some example embodiments, the second substrate 810 and the common source line 820 may not be disposed in an area in which the second input-output contact plug 803 is disposed. Alternatively or additionally, the second input-output pad 805 may not overlap the word lines 830 in the vertical direction. Referring to FIG. 26, the second input-output contact plug 803 may be separated from the second substrate 810 in a direction, parallel to the upper surface of the second substrate 810, and may pass through the upper insulating film 801 of the memory cell region CELL to be connected to the second input-output pad 805.

According to some example embodiments, the first input-output pad 705 and the second input-output pad 805 may be selectively formed. For example, the memory device 900 may include only the first input-output pad 705 disposed on the first substrate 710 or the second input-output pad 805 disposed on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA, respectively included in the memory cell region CELL and the peripheral circuit region PERI. As used herein, a dummy pattern may correspond to a pattern that, although fabricated, does not send or receive electrical signals within the memory device 900

In the external pad bonding area PA, the memory device 900 may include a lower metal pattern 773a, corresponding to upper metal patterns 871a and 872a formed in an uppermost metal layer of the memory cell region CELL, and having the same shape as the upper metal pattern 872a of the memory cell region CELL, in an uppermost metal layer of the peripheral circuit region PERI. In the peripheral circuit region PERI, the lower metal pattern 773a formed in the uppermost metal layer of the peripheral circuit region PERI may not be connected to a contact. Similarly, in the external pad bonding area PA, an upper metal pattern, corresponding to lower metal patterns 771a and 772a formed in an uppermost metal layer of the peripheral circuit region PERI, and having the same shape as the lower metal pattern 772a of the peripheral circuit region PERI, may be formed in an uppermost metal layer of the memory cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the memory cell region CELL by a Cu—Cu bonding.

Alternatively or additionally, in the bit line bonding area BLBA, an upper metal pattern 892, corresponding to lower metal patterns 751 and 752 formed in the uppermost metal layer of the peripheral circuit region PERI, and having the same shape as the lower metal pattern 752 of the peripheral circuit region PERI, may be formed in an uppermost metal layer of the memory cell region CELL. A contact may not be formed on the upper metal pattern 892 formed in the uppermost metal layer of the memory cell region CELL.

In some example embodiments, corresponding to a metal pattern formed in an uppermost metal layer in one of the memory cell region CELL and the peripheral circuit region PERI, a reinforcement metal pattern having the same shape as the metal pattern may be formed in an uppermost metal layer in another one of the memory cell region CELL and the peripheral circuit region PERI, and a contact may not be formed on the reinforcement metal pattern.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts has been particularly shown and described with reference to embodiments thereof, it will be understood that various changes in form and details may be made therein without departing from the spirit and scope of the following claims.

What is claimed is:

1. A vertical memory device comprising:
    a plurality of word lines on a substrate, the plurality of word lines extending in a horizontal direction that is parallel to a main surface of the substrate, the plurality of word lines stacked in a vertical direction;
    a plurality of word line cut regions extending parallel to each other in a first horizontal direction and defining widths of the plurality of word lines, the widths in a second horizontal direction perpendicular to the first horizontal direction;
    a memory cell array comprising a plurality of channel structures extending on the substrate in the vertical direction through the plurality of word lines and arranged in a honeycomb structure;
    a plurality of contacts on the plurality of channel structures; and
    a plurality of bit lines connected to the plurality of channel structures through the plurality of contacts, the plurality of bit lines including first to fourth bit lines;
    a string select line overlapping the plurality of word lines in the vertical direction; and
    a plurality of select line cut regions defining a width of the string select line in the second horizontal direction,
    wherein the memory cell array comprises a first sub-array and a second sub-array, which are defined by the plurality of word line cut regions and are connected to some identical bit lines from among the plurality of bit lines,
    wherein each of the first sub-array and the second sub-array comprises a plurality of channel groups separated from each other by the plurality of select line cut regions,
    wherein a layout of contacts in the first sub-array from among the plurality of contacts is different from a layout of contacts in the second sub-array from among the plurality of contacts,
    wherein the plurality of channel structures comprise first-type channel structures arranged adjacent to the word line cut regions, second-type channel structures arranged adjacent to the select line cut regions, and third-type channel structures surrounded by other channel structures, and
    wherein each of the plurality of channel groups comprises at least two types of channel structures among the first-type channel structures, second-type channel structures and third-type channel structures.

2. The vertical memory device of claim 1, wherein a gap between the plurality of bit lines is less than a width of each of the plurality of channel structures.

3. The vertical memory device of claim 1, wherein a layout of channel structures included in each of the plurality of channel groups is identical.

4. The vertical memory device of claim 1, wherein the plurality of select line cut regions have wave shapes in a cross-section, the cross-section parallel to the main surface of the substrate.

5. The vertical memory device of claim 1, wherein each of the first sub-array and the second sub-array are connected to the first to fourth bit lines from among the plurality of bit lines, and
    each of the plurality of channel groups comprises a first channel structure and a second channel structure which are aligned with each other in the second horizontal direction, and each of the plurality of channel groups comprises a third channel structure and a fourth channel structure, which are aligned with each other in the second horizontal direction.

6. The vertical memory device of claim 5, wherein the first channel structure of each of the plurality of channel groups included in the first sub-array connects to the second bit line, and the first channel structure of each of the plurality of channel groups comprised in the second sub-array connects to the first bit line.

7. The vertical memory device of claim 5, wherein the first sub-array comprises first to fourth channel groups aligned with each other in the second horizontal direction,
    the first channel structure of each of the first channel group and the second channel group connects to the second bit line, and
    the first channel structure of each of the third channel group and the fourth channel group connects to the first bit line.

8. The vertical memory device of claim 5, wherein the first sub-array comprises first to fourth channel groups aligned with each other in the second horizontal direction,
    the first channel structure of each of the first channel group and the fourth channel group connects to the second bit line, and
    the first channel structure of each of the second channel group and the third channel group connects to the first bit line.

9. The vertical memory device of claim 5, wherein the first sub-array comprises first to fourth channel groups aligned with each other in the second horizontal direction,
    the first channel structure of each of the first channel group, the second channel group, and the fourth channel group connects to the second bit line, and the first channel structure of the third channel group connects to the first bit line.

10. The vertical memory device of claim 1, wherein the memory cell array comprises a third sub-array connected to different bit lines from the bit lines connected to the first sub-array,
    the third sub-array is aligned with the first sub-array in the first horizontal direction, and the layout of the contacts in the first sub-array from among the plurality of contacts is the same as a layout of contacts in the third sub-array from among the plurality of contacts.

11. The vertical memory device of claim 1, wherein the memory cell array comprises a third sub-array connected to different bit lines from the bit lines connected to the first sub-array,
the third sub-array is aligned with the first sub-array in the first horizontal direction, and
the layout of the contacts in the first sub-array from among the plurality of contacts is different from a layout of contacts in the third sub-array from among the plurality of contacts.

12. A vertical memory device comprising:
a plurality of word lines extending on a substrate in a horizontal direction parallel to a main surface of the substrate, the plurality of word lines overlapping each other in a vertical direction;
a plurality of word line cut regions extending parallel to each other in a first horizontal direction and defining widths of the plurality of word lines in a second horizontal direction, the second horizontal direction perpendicular to the first horizontal direction;
a memory cell array comprising a plurality of channel structures which extend, on the substrate in the vertical direction through the plurality of word lines;
a plurality of contacts arranged on the plurality of channel structures;
a plurality of bit lines connected to the plurality of channel structures through the plurality of contacts, the plurality of bit lines including first to fourth bit lines;
a string select line overlapping the plurality of word lines in the vertical direction; and
a plurality of select line cut regions defining a width of the string select line in the second horizontal direction,
wherein the memory cell array comprises a first sub-array and a second sub-array which are defined by the plurality of word line cut regions and are connected to first to fourth bit lines from among the plurality of bit lines,
wherein each of the first sub-array and the second sub-array comprises a plurality of channel groups separated from each other by the plurality of select line cut regions,
wherein a layout of contacts in the first sub-array from among the plurality of contacts is different from a layout of contacts in the second sub-array from among the plurality of contacts,
wherein the plurality of channel structures comprise first-type channel structures arranged adjacent to the word line cut regions, second-type channel structures arranged adjacent to the select line cut regions, and third-type channel structures surrounded by other channel structures, and
wherein each of the plurality of channel groups comprises at least two types of channel structures among the first-type channel structures, second-type channel structures and third-type channel structures.

13. The vertical memory device of claim 12, wherein two bit lines are arranged over one of the plurality of channel structures and overlap the one of the plurality of channel structures in the vertical direction.

14. The vertical memory device of claim 12, wherein each of the first sub-array and the second sub-array comprises four or more channel groups.

15. The vertical memory device of claim 12, wherein each of the first sub-array and the second sub-array comprises first to fourth channel groups aligned with each other in the second horizontal direction, and
a parasitic capacitance of a channel structure in the first channel group of the first sub-array and connected to the first bit line is different from a parasitic capacitance of a channel structure in the first channel group of the second sub-array and connected to the first bit line.

16. The vertical memory device of claim 12, wherein a layout of channel structures comprised in each of the plurality of channel groups is identical.

17. The vertical memory device of claim 12, wherein the plurality of channel structures are not in the plurality of select line cut regions.

18. A vertical memory device comprising:
a memory cell region including a first metal pad; and
a peripheral circuit region including a second metal pad, the peripheral circuit region vertically connected to the memory cell region by the first metal pad and the second metal pad,
wherein the memory cell region includes a plurality of word lines and a string select line, the plurality of word lines and the string select line extending on a substrate in a horizontal direction parallel to a main surface of the substrate, the plurality of word lines overlapping each other in a vertical direction;
a plurality of word line cut regions extending parallel to each other in a first horizontal direction and defining widths of the plurality of word lines in a second horizontal direction that is perpendicular to the first horizontal direction;
a plurality of select line cut regions defining a width of the string select line in the second horizontal direction;
a memory cell array comprising a plurality of channel structures, which extend, on the substrate, in the vertical direction through the plurality of word lines and are arranged in a honeycomb structure;
a plurality of contacts on the plurality of channel structures;
the string select line overlapping the plurality of word lines in the vertical direction; and
a plurality of bit lines connected to the plurality of channel structures through the plurality of contacts,
wherein two bit lines are arranged over one of the plurality of channel structures and overlap the one of the plurality of channel structure in the vertical direction,
wherein the memory cell array comprises a first sub-array and a second sub-array, the first sub-array and the second sub-array defined by the plurality of word line cut regions and connected to first to fourth bit lines from among the plurality of bit lines,
wherein each of the first sub-array and the second sub-array comprises a plurality of channel groups separated from each other by the plurality of select line cut regions,
wherein a layout of contacts in the first sub-array from among the plurality of contacts is different from a layout of contacts in the second sub-array from among the plurality of contacts,
wherein the plurality of channel structures comprise first-type channel structures arranged adjacent to the word line cut regions, second-type channel structures arranged adjacent to the select line cut regions, and third-type channel structures surrounded by other channel structures, and wherein each of the plurality of channel groups comprises at least two types of channel structures among the first-type channel structures, second-type channel structures and third-type channel structures.

\* \* \* \* \*